(12) United States Patent
Rebstock

(10) Patent No.: US 9,004,561 B2
(45) Date of Patent: Apr. 14, 2015

(54) SEMICONDUCTOR CLEANER SYSTEMS AND METHODS

(71) Applicant: Lutz Rebstock, Gaienhofen (DE)

(72) Inventor: Lutz Rebstock, Gaienhofen (DE)

(*) Notice: Subject to any disclaimer, the term of this patent is extended or adjusted under 35 U.S.C. 154(b) by 0 days.

(21) Appl. No.: 14/251,564

(22) Filed: Apr. 11, 2014

(65) Prior Publication Data
US 2014/0219750 A1 Aug. 7, 2014

Related U.S. Application Data

(63) Continuation of application No. 13/531,502, filed on Jun. 23, 2012, now Pat. No. 8,696,042.

(60) Provisional application No. 61/500,608, filed on Jun. 23, 2011.

(51) Int. Cl.
*H01L 21/687* (2006.01)
*H01L 21/67* (2006.01)
*H01L 21/673* (2006.01)

(52) U.S. Cl.
CPC .... *H01L 21/67028* (2013.01); *H01L 21/67017* (2013.01); *H01L 21/67173* (2013.01); *H01L 21/67359* (2013.01); *Y10S 294/902* (2013.01)

(58) Field of Classification Search
USPC .......... 294/2, 86.4, 119.1, 213, 902; 414/225.01, 806, 941; 901/38, 39
See application file for complete search history.

(56) References Cited

U.S. PATENT DOCUMENTS

| | | | | |
|---|---|---|---|---|
| 4,723,353 A * | 2/1988 | Monforte | ......................... | 483/10 |
| 5,050,919 A * | 9/1991 | Yakou | ............................. | 294/2 |
| 5,123,804 A * | 6/1992 | Ishii et al. | ..................... | 414/680 |
| 5,192,106 A * | 3/1993 | Kaufman | ..................... | 294/99.2 |
| 5,700,046 A * | 12/1997 | Van Doren et al. | ......... | 294/119.1 |
| 6,015,174 A * | 1/2000 | Raes et al. | ......................... | 294/2 |
| 6,062,241 A * | 5/2000 | Tateyama et al. | ............. | 134/137 |
| 6,837,672 B1* | 1/2005 | Tateyama et al. | ............. | 414/815 |
| 7,367,601 B2* | 5/2008 | Ogimoto | ....................... | 294/185 |
| 7,520,545 B2* | 4/2009 | Kim | ............................... | 294/213 |
| 8,696,042 B2* | 4/2014 | Rebstock | ................... | 294/119.1 |
| 2003/0190886 A1 | 10/2003 | Hirasawa | | |
| 2009/0263230 A1* | 10/2009 | Hwang | ......................... | 414/806 |

OTHER PUBLICATIONS

PCT preliminary report on patentability-PCT/IB2012/001250-dated Dec. 23, 2013.

* cited by examiner

*Primary Examiner* — Dean Kramer

(57) ABSTRACT

In an embodiment, the present invention discloses a EUV cleaner system and process for cleaning a EUV carrier. The euv cleaner system comprises separate dirty and cleaned environments, separate cleaning chambers for different components of the double container carrier, gripper arms for picking and placing different components using a same robot handler, gripper arms for holding different components at different locations, horizontal spin cleaning and drying for outer container, hot water and hot air (70 C) cleaning process, vertical nozzles and rasterizing megasonic nozzles for cleaning inner container with hot air nozzles for drying, separate vacuum decontamination chambers for outgassing different components, for example, one for inner and one for outer container with high vacuum (e.g., <$10^{-6}$ Torr) with purge gas, heaters and RGA sensors inside the vacuum chamber, purge gas assembling station, and purge gas loading and unloading station.

13 Claims, 27 Drawing Sheets

SEMICONDUCTOR CLEANER SYSTEMS AND METHODS

This application is a continuation of and claims priority from U.S. patent application Ser. No. 13/531,502, filed on Jun. 23, 2012, which is now U.S. Pat. No. 8,696,042, entitled "Semiconductor cleaner systems and methods"; which claims priority from U.S. Provisional Patent Application Ser. No. 61/500,608, filed on Jun. 23, 2011, entitled "Semiconductor cleaner systems and methods"; all of which are incorporated herein by reference.

BACKGROUND

The production of semiconductor components requires cleanliness, such as control of particles, impurities, or foreign matter. The presence of these particulates can affect the yield of good devices within the processed wafers. Thus the transport of these wafers is typically carried out in special transport container, such as cassettes, carriers or trays, as well as closable or sealable containers or boxes, including Front Opening Unified Pod [FOUP], Front-Opening Shipping Box [FOSB], Standard Mechanical Interface [SMIF] pods or boxes. The FOUP typically possesses comblike guidance at two facing long sides for supporting the wafers, and can be closed with a removable cover. Without the cover the FOUP is a hollow container having a pot-like basic form with a rectangular surface area. In addition to wafers, reticles are also stored in reticle carriers, which are stored in a reticle stocker. The reticle carriers are transported to the lithography tool when needed for mask exposure.

The FOUPs and reticle carriers need to be cleaned occasionally to maintain the standard of cleanliness required in processing semiconductor wafers. The cleaning process can be performed in special cleaning and drying equipment. With increasing requirements for cleanliness, the number of cleaning cycles in the modern semiconductor factories rises, together with increased requirements for cleanliness. For example, it is desirable to clean a FOUP after each individual use in order to prevent, for example cross contamination from one wafer load to the next.

Thus it is desirable to shorten the time needed for a complete cleaning of the FOUPs. Furthermore, it is also desirable to keep cleaning consumption as small as possible, especially in view of the increased cleaning cycles. On the other hand, the cleaning must be very thorough in order to fulfill the cleanliness requirements of modern semiconductor factories.

SUMMARY

In an embodiment, the present invention discloses a cleaner system and process for cleaning a workpiece, such as a carrier. The cleaner system comprises at least one of separate dirty and cleaned environments, separate cleaning chambers for different components of the double container carrier, gripper arms for picking and placing different components using a same robot handler, gripper arms for holding different components at different locations, horizontal spin cleaning and drying for outer container, hot water and hot air (70 C) cleaning process, vertical nozzles and rasterizing megasonic nozzles for cleaning inner container with hot air nozzles for drying, separate vacuum decontamination chambers for outgassing different components, for example, one for inner and one for outer container with high vacuum (e.g., <$10^{-6}$ Torr) with purge gas, heaters and gas monitor (e.g., RGA sensors) inside the vacuum chamber, purge gas assembling station, and purge gas loading and unloading station.

DETAILED DESCRIPTION OF THE PREFERRED EMBODIMENTS

The present invention discloses methods and apparatuses for integrated cleaning of objects, such as semiconductor workpiece containers and reticle carriers. The cleaning process can include liquid cleaning, drying, and vacuum decontamination.

Cleaning methods consist of ways to remove particles and/or contamination such as organic, inorganic metals, native oxide and particulate matters as well as removing water spots. Cleaning can be a critical requirement for semiconductor articles such as cassettes, FOUP, holders, carriers, etc. In the cleaning process, removal of particles in the range of few microns down to sub-micron levels and reduction of trace contaminants (metals or ions) have become part of the concerns of semiconductor cleaning industry.

The cleaning process can provide effective object cleaning with minimum liquid residue, which can assist in the subsequent drying process. For example, the article to be cleaned is positioned with minimum liquid traps, such as on horizontal or vertical surfaces. In addition, at potential trap locations, gas nozzles can be located to blow away any trapped liquid to help in minimizing liquid residue and assisting the drying process. Gas nozzles preferably provide nitrogen or filtered air, but can also provide liquid or aerated liquid. In an aspect, gas nozzles can perform cleaning action, and liquid nozzles can remove trapped liquid.

In an embodiment, the present invention discloses cleaning processes and systems for high level cleanliness articles, such as extreme ultraviolet (EUV) reticle carriers. The following description uses EUV reticle carriers are example, but the invention is not so limited, and can be applied toward any objects having stringent cleanliness requirements, such as low particulate contaminations and low outgassing components.

Figure 1:
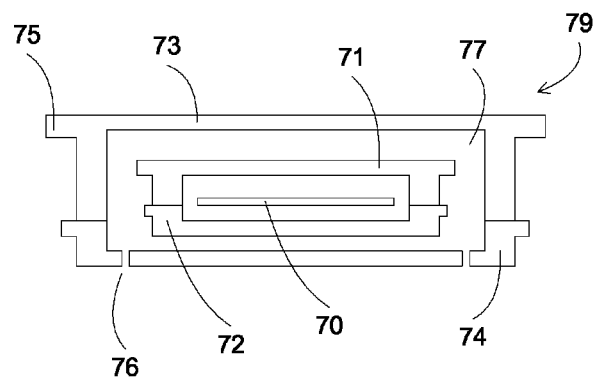
FIG. 1 illustrates an exemplary configuration of a EUV reticle carrier to be cleaned.

FIG. 1 illustrates an exemplary configuration of a EUV reticle carrier 79 to be cleaned. A EUV reticle 70 is typically stored in double-container carrier 79, together with having nitrogen in the space 77 between the inner container and the outer container. An inner container is typically made of metal, comprising an upper lid 71 mated with a lower support 72. An outer container is typically made of low outgassing polymer, comprising an upper lid 73 mated with a lower support 74. Both containers can have handles for holding by an operator or by an automatic transport system. A handle 75 is shown for the upper lid 73 of the outer container. The support 74 of the outer container can have inlets for accepting nitrogen purge to the inner volume 77 of the reticle carrier.

The double container euv reticle carrier is an example of the high level of cleanliness for semiconductor processing, where the reticle is stored in two levels of container to prevent contamination. In addition, the volume between the two levels is purged with nitrogen to avoid bacteria growth, or to prevent outgassing particles from the outer container to attach to the inner container. Thus a cleaner system for such cleaned objects requires improved features to maintain the desired level of cleanliness after being cleaned.

In an embodiment, the present invention discloses separating a dirty environment before cleaning with a cleaned environment after cleaning. The separation can maintain the cleanliness of the objects after being cleaned, for example, by preventing the cleaned objects from being contaminated with contaminants in the dirty environment. In the following description, the term "dirty" is used to indicate a relationship to the term "clean", and is meant to indicate a less clean environment. For example, an object can be dirty, e.g., in need of cleaning, in term of cleanliness levels required in semiconductor processing, and not of everyday operation. After cleaning, the object can be clean, e.g., cleaner than before, when the object is in the dirty state.

In an embodiment, the cleaner system comprises one or more cleaning chambers with separate input and output ports to communicate with separated dirty environment and cleaned environment. For example, a cleaning chamber has an input port coupled to a dirty environment for accepting object to be cleaned. The cleaning chamber also has a separate output port coupled to a cleaned environment for transferring the objects after being cleaned in the cleaning chamber to a cleaned environment. The cleaning chamber thus separates the cleaner system into an input dirty environment and an output cleaned environment. The input and output ports of the cleaning chamber are synchronized to prevent cross contamination between the dirty and the cleaned environments. For example, only one port is open at one time to prevent dirty air in the dirty environment from entering the cleaned environment. In an embodiment, the cleaning chamber has cleaned purge gas (either clean compressed air or nitrogen) before opening the output port to the cleaned environment. In addition, a positive pressure can be established in the cleaning chamber before opening the input port to the dirty environment, thus minimizing any backflow of dirty air from the dirty environment. A negative pressure can be established in the cleaning chamber before opening the output port to the cleaned environment, thus minimizing any backflow of dirty air to the cleaned environment.

In an embodiment, different loading ports can be used. For example, input loading ports are used in dirty environment for accepting objects to be cleaned. Separate output unloading ports are used in cleaned environment for outputting cleaned objects. Further, different robot handling systems can be used. For example, a dirty robot is used in the dirty environment and a separate cleaned robot is used in the cleaned environment.

Different levels of cleanliness can be established in the dirty and cleaned environments. For example, the dirty environment can have filter laminar flow. The cleaned environment can have improved cleanliness, for example, filtered recirculated air or nitrogen flow with raised floor and chiller. The recirculation of flow in the cleaned environment can isolate the cleaned chamber from the outside ambient, thus minimizing any possible contamination from outside air. A chiller can be installed in the recirculation path, cooling the air or nitrogen flow and preventing thermal agitation of air molecules.

In addition, a clean air curtain comprising fans at a top ceiling and fans at a bottom floor at the interface with the output port of cleaning chamber can further isolate the cleaned environment from any potential connection with the dirty environment.

In an embodiment, the serviceable components are preferably located in dirty environment to minimizing access to the cleaned environment, thus keeping the cleaned environment as clean as possible.

Figure 2:
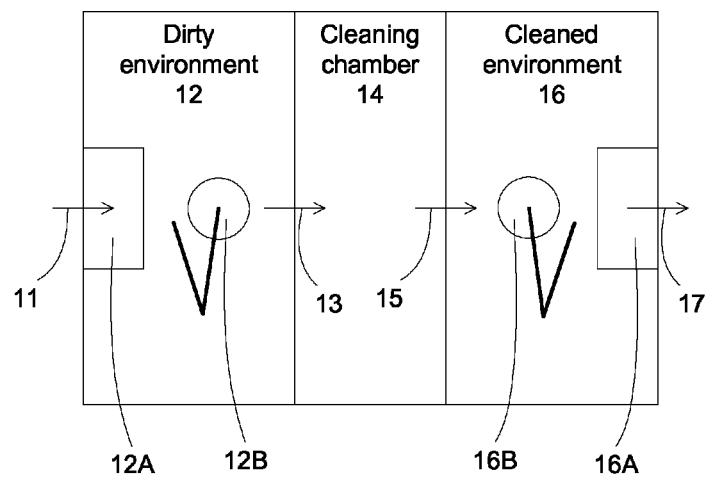
FIG. 2 illustrates an exemplary configuration of a cleaning system according to an embodiment of the present invention.

FIG. 2 illustrates an exemplary configuration of a cleaning system according to an embodiment of the present invention. A cleaning chamber 14 separates the dirty environment 12 from the cleaned environment 16, with a dirty robot 12B and an input loading port 12A located in the dirty environment 12, and a cleaned robot 16B and an output unloading port 16A located in the cleaned environment 16. In a typical workpiece flow, a object to be cleaned, such as a euv reticle carrier, is loaded 11 to the input loading port 12A, then is transferred 13 by the dirty robot 12B to the cleaning chamber 14. After being cleaned in the cleaning chamber 14, the cleaned object is transferred 15 by the cleaned robot 16B to the output unloading port 16A to be unloaded 17. The cleaning chamber can have separate input door and output door, with the dirty object entering the dirty input door 13, and the cleaned object exiting the clean output door 15. Further considerations can be included to prevent cross contamination between the clean and dirty environment. For example, higher pressure can be established in the clean environment during the transfer of the clean object to generate a laminar flow away from the clean environment, minimizing particles backflow from the dirty environment. In addition, isolation can be established between the clean and dirty environment, for example, by interlocking the cleaning chamber doors, preventing the input door and the output door to be open at a same time.

Figure 3A:
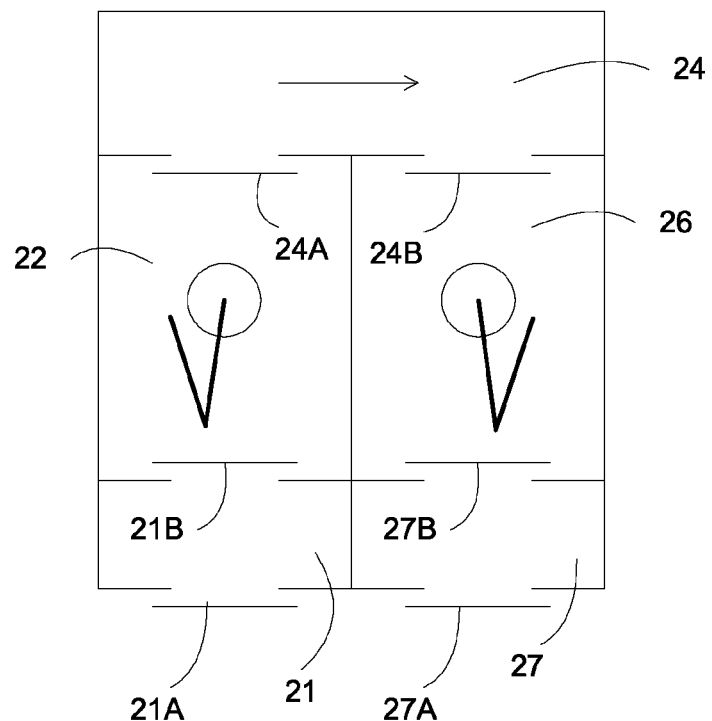
FIGS. 3A-3C illustrate different configurations for a cleaner system according to an embodiment of the present invention.
Figure 3B:
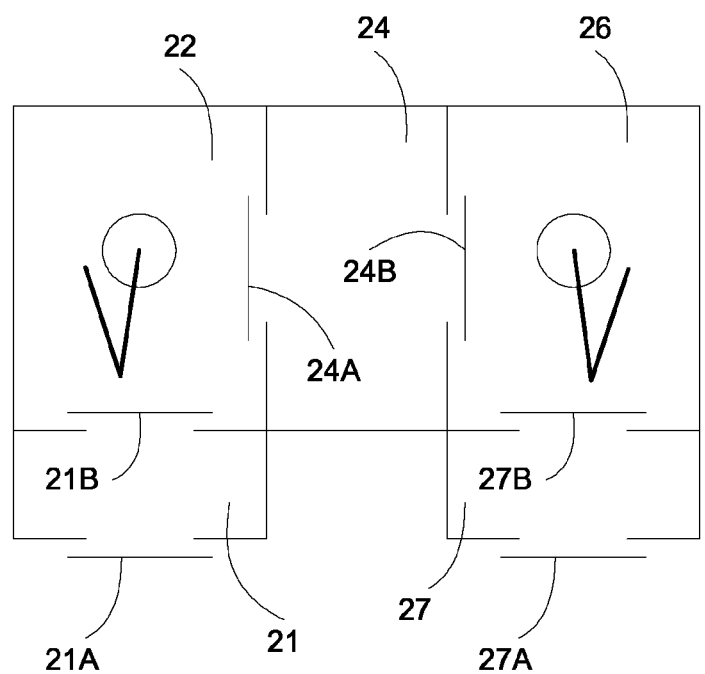
Figure 3C:
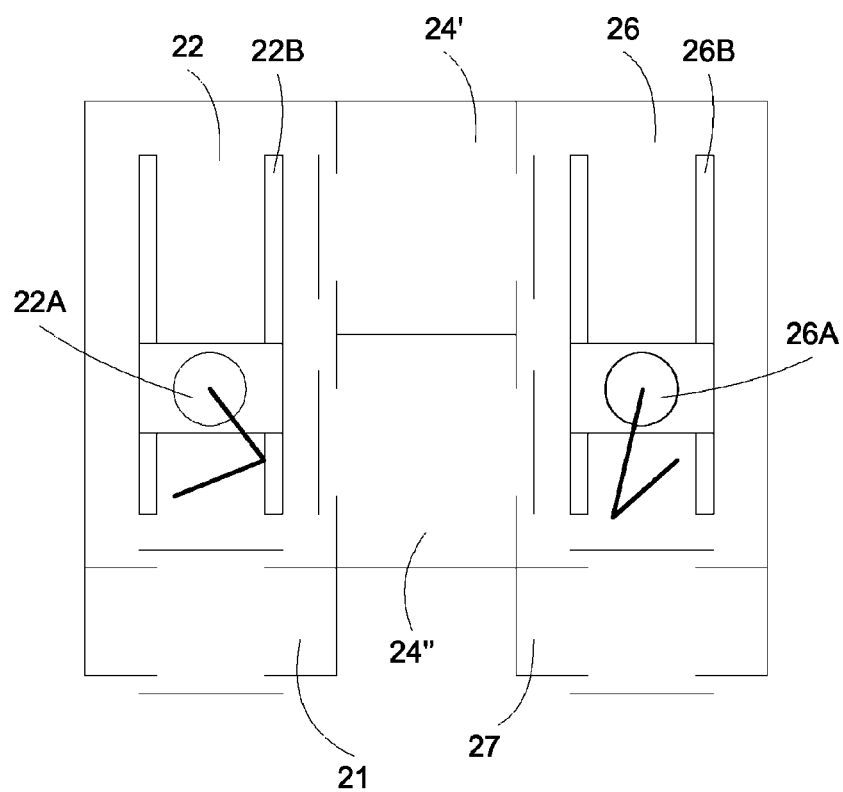

FIGS. 3A-3C illustrate different configurations for a cleaner system according to an embodiment of the present invention. In FIG. 3A, the dirty environment 22 and the cleaned environment 26 are located side-by-side with the input loading port 21 and the output unloading port 27. An input loading door 21A is first opened to accept a dirty object to the input loading port 21. After closing the input loading door 21A, the output loading door 21B is opened, and the dirty object can be picked up by the dirty robot. After closing the output loading door 21B, the input chamber door 24A is opened, and the dirty object can be transferred to the cleaning chamber 24. After cleaning, the object can be transferred to the output chamber door 24B, which is then opened so that the cleaned object can be picked up by the cleaned robot. The cleaned object is then transferred to the output unloading port 27 and then to the outside ambient through the doors 27B and 27A.

FIG. 3B illustrates another configuration where the cleaning chamber 24 has two opposite input door 24A and output door 24B. FIG. 3C illustrates another configuration where the cleaner system has a number of cleaning chambers, where two cleaning chamber 24' and 24" are shown. Linear guides 22B and 26B in dirty and cleaned environments, respectively, can transport dirty and cleaned robots 22A and 26A, respectively, to and from different cleaning chambers 24' and 24".

In addition to the separation of environments before cleaning and after cleaning, the environments can be maintained at different cleanliness. For example, at the input section where the object is dirty, a dirtier environment can be established. At the output section where the object has been cleaned and thus is cleaner, a clean environment can be established.

Figure 4A:
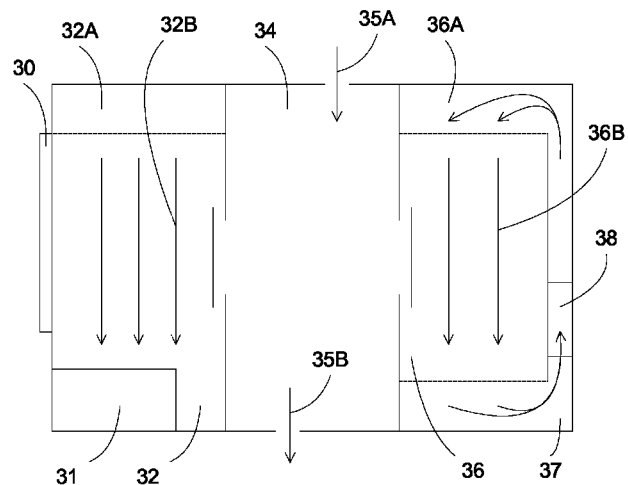
FIGS. 4A-4B illustrate exemplary flow configurations for a dirty and a cleaned environments according to an embodiment of the present invention.
Figure 4B:
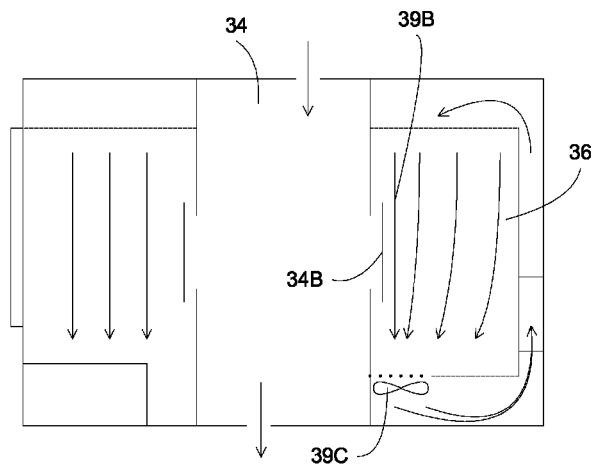

FIGS. 4A-4B illustrate exemplary flow configurations for a dirty and a cleaned environments according to an embodiment of the present invention. FIG. 4A illustrates a laminar flow 32B in dirty environment 32, passing through the filter system 32A. Electronic equipment 31 can be located in the dirty environment 32, which can be accessed through service door 30. The cleaned environment 36 has recirculating flow 36B, passing through raised floor 37, entering chiller 38, and filtered by filter system 36A. The closed environment can isolate the cleaned environment 36 from the outside ambient, further improving the cleanliness of the cleaned environment. Sandwiching between the two environments 32 and 36 is the cleaning chamber 34, which comprises purge gas inlet 35A and purge gas outlet 35B.

FIG. 4B illustrates an exemplary curtain gas flow for the cleaned environment according to an embodiment of the present invention. A fan system 39C is located in front of the output port of the cleaning chamber, thus modifying the flow 39B in the cleaned environment, so that a curtain flow is established at the output door 34B. This curtain flow can minimize any back flow from the cleaning chamber 34, thus preventing any cross contamination to the cleaned environment.

In addition to maintaining different levels of cleanliness for the input and output sections of the cleaning system, gas purging can be provided during the communication between the sections to minimizing cross contamination between the sections. For example, a positive pressure or flow can be established from the clean environment to the dirty environment during a door between the two sections is open. Alternatively, negative pressure can be established in the dirty environment to also form positive pressure or flow from the clean environment to the dirty environment.

Figure 5A:
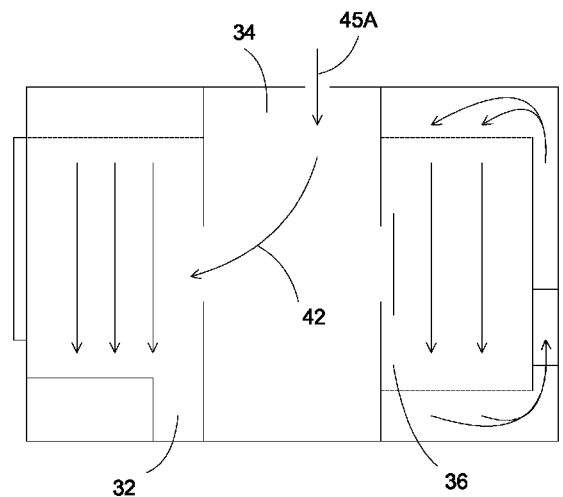
FIGS. 5A-5B illustrate exemplary configurations for purging the cleaning chamber according to an embodiment of the present invention.
Figure 5B:
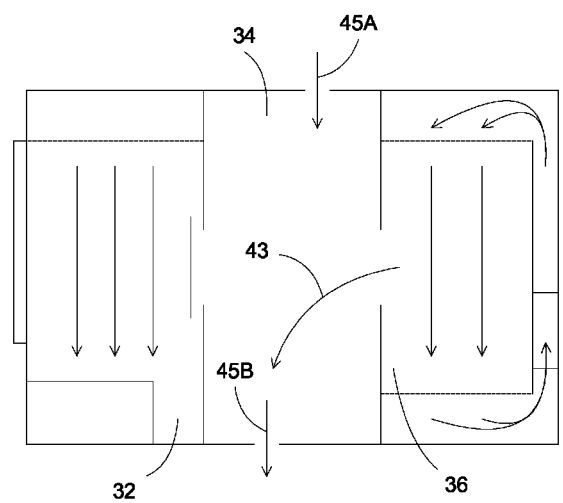

FIGS. 5A-5B illustrate exemplary configurations for purging the cleaning chamber according to an embodiment of the present invention. In FIG. 5A, cleaning chamber 34 is pressurized, or purged with cleaned gas 45A before opening the input door to the dirty environment 32. After the input door is opened, a positive flow 42 can be established from the cleaning chamber 34 to the dirty environment 32, thus minimizing any cross contamination resulted from a back flow from the dirty environment. The pressure in the cleaning chamber 34 can be equal or greater than the pressure in the dirty environment 32.

In FIG. 5B, cleaning chamber 34 is evacuated, or pressure regulated with cleaned gas inlet 45A and outlet 45B before opening the output door to the cleaned environment 36. After the output door is opened, a positive flow 43 can be established from the cleaned environment 36 to the cleaning chamber 34, thus minimizing any cross contamination resulted from a back flow to the cleaned environment. The pressure in the cleaning chamber 34 can be equal or lower than the pressure in the cleaned environment 36.

In some embodiments, the present invention discloses a system for cleaning a workpiece, such as a reticle carrier. The system can include a first station, wherein the first station comprises a first robotic mechanism for transferring a workpiece. The first station can be an input section of the cleaning system, which can be configured to accept a dirty workpiece, e.g., a workpiece that is needed to be cleaned. The system can include a second station, wherein the second station comprises a second robotic mechanism for transferring a workpiece. The second station can be an output section of the clean system, which can be configured to accept a cleaned workpiece, e.g., a workpiece that has been cleaned by the cleaning system. The system can include a chamber, wherein the chamber is operable to clean a workpiece. The chamber can include an entrance, wherein the entrance is operable for enabling a workpiece to be transferred from the first station to the chamber by the first robotic mechanism. The chamber can include an exit, wherein the exit is operable for enabling a workpiece to be transferred from the chamber to the second station by the second robotic mechanism. The chamber can include liquid nozzles for delivering cleaning liquid, drying nozzles for delivering drying gas, and optional heaters for heating the workpiece. The second station can be isolated from the first station. In general, the first station and the second station sandwich the cleaning chamber, and thus are isolated from each other. In some embodiments, the first and second stations are also isolated during the operation of the cleaning system. For example, the cleaning chamber can be configured to isolate the first/second station when the cleaning chamber is exposed to the second/first station, respectively. A door facing the first station can be close when a door facing the second station is open, thus isolating the first and second stations. The environment of the second station is cleaner than the environment of the first station. Since the first station houses the dirty workpiece, and the second station houses the cleaned workpiece, maintaining the second station cleaner than the first station can be beneficial with regard to the workpiece cleanliness. For example, the first station comprises filter laminar flow coupled to the outside ambient. The second station comprises filter recirculation gas flow with raised floor and chiller, which can maintain a much cleaner ambient. The system can include a mechanism to establish a curtain flow at the exit of the chamber.

In some embodiments, the cleaning system can include multiple chambers for cleaning multiple workpieces. For example, a first chamber can be used to clean a first component of the workpiece, and a second chamber can be used to clean a second component of the workpiece. The system can include an input load port coupled to the first station for accepting a workpiece to be transferred to the chamber. The system can include an output load port coupled to the second station for accepting a workpiece from the chamber. For isolating the first and second stations, in some embodiments, the entrance and exit of the chamber are not open at a same time to provide isolation of the first station from the second station. The system can include a mechanism to establish a flow from the second station to the chamber during the opening of the entrance or from the chamber to the first station during the opening of the exit.

During the transfer of object, e.g., from the input port (dirty) to the cleaning chamber (for cleaning) to the output port (clean), conditions can be established to minimizing recontamination of the cleaned object.

Figure 6A:
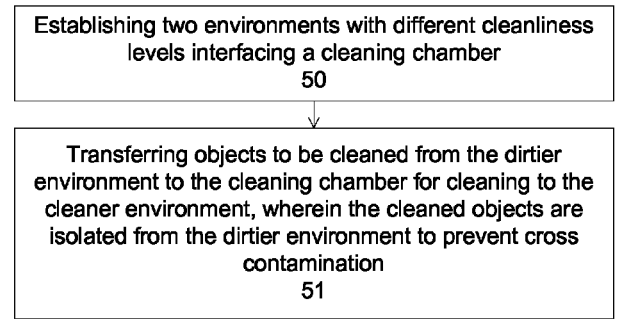
FIGS. 6A-6B illustrate exemplary flowcharts for cleaning objects using separate dirty and cleaned environments according to an embodiment of the present invention.
Figure 6B:
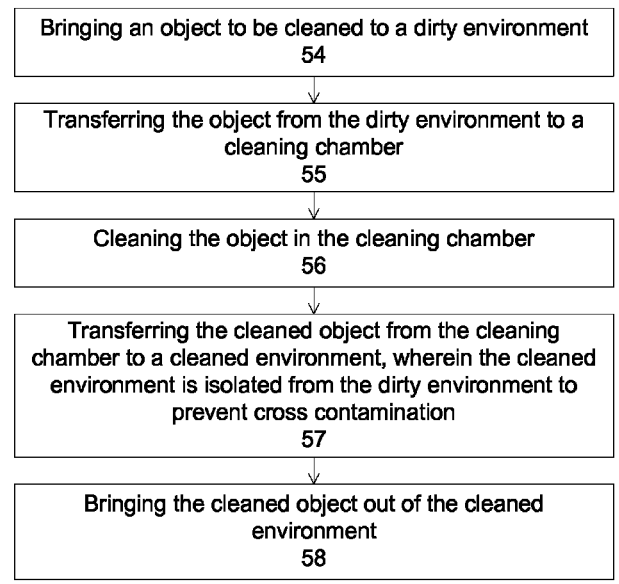

FIGS. 6A-6B illustrate exemplary flowcharts for cleaning objects using separate dirty and cleaned environments according to an embodiment of the present invention. In FIG. 6A, operation 50 establishes two environments with different cleanliness levels interfacing a cleaning chamber. Operation 51 transfers objects to be cleaned from the dirtier environment to the cleaning chamber to the cleaner environment, wherein the cleaned objects are isolated from the dirtier environment to prevent cross contamination.

In FIG. 6B, operation 54 brings an object to be cleaned to a dirty environment. Operation 55 transfers the object from the dirty environment to a cleaning chamber. Operation 56 cleans the object in the cleaning chamber. Operation 57 transfers the cleaned object from the cleaning chamber to a cleaned environment, wherein the cleaned environment is isolated from the dirty environment to prevent cross contamination. Operation 58 brings the cleaned object out of the cleaned environment.

Figure 7:
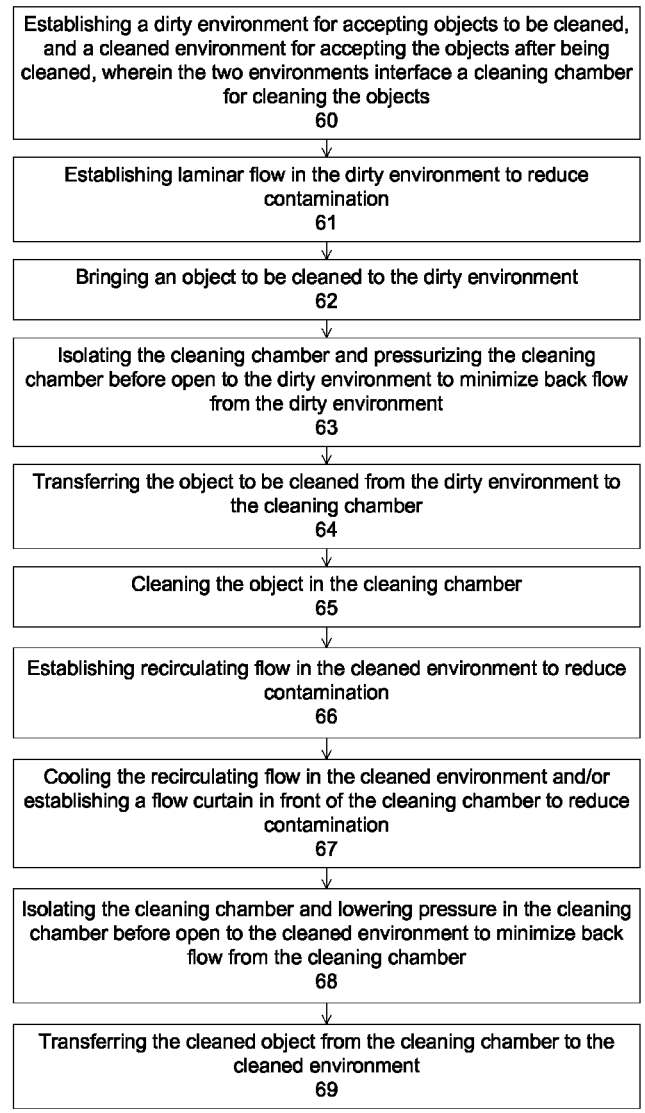
FIG. 7 illustrates another exemplary cleaning process using separate dirty and cleaned environments according to an embodiment of the present invention.

FIG. 7 illustrates another exemplary cleaning process using separate dirty and cleaned environments according to an embodiment of the present invention. In FIG. 7, operation 60 establishes a dirty environment for accepting objects to be cleaned, and a cleaned environment for accepting the objects after being cleaned, wherein the two environments interface a cleaning chamber for cleaning the objects. Operation 61 establishes laminar flow in the dirty environment to reduce contamination. Operation 62 brings an object to be cleaned to the dirty environment. Operation 63 isolates the cleaning chamber and pressurizing the cleaning chamber before open to the dirty environment to minimize back flow from the dirty environment. Operation 64 transfers the object to be cleaned from the dirty environment to the cleaning chamber. Operation 65 cleans the object in the cleaning chamber. Operation 66 establishes recirculating flow in the cleaned environment to reduce contamination. Operation 67 cools the recirculating flow in the cleaned environment and/or establishing a flow curtain in front of the cleaning chamber to reduce contamination. Operation 68 isolates the cleaning chamber and lowering pressure in the cleaning chamber before open to the cleaned environment to minimize back flow from the cleaning chamber. Operation 69 transfers the cleaned object from the cleaning chamber to the cleaned environment.

In some embodiments, the present invention discloses a method for cleaning a workpiece. The method can include transferring a workpiece from a first station to a chamber through an entrance of the cleaning chamber. The method can include cleaning the workpiece in the cleaning chamber. The method can include transferring the workpiece from the chamber to a second station through an exit of the chamber. The second station is isolated from the first station. The environment of the second station is cleaner than the environment of the first station.

In some embodiments, the method can further include loading the workpiece to an input load port to be transferred to the first station. The method can also include unloading the workpiece from the second station to an output load port. The method can also include closing the exit of the chamber before transferring the workpiece from the first station to the chamber. The method can also include pressurizing the chamber before opening the entrance of the chamber for transferring the workpiece from the first station to the chamber. The method can also include closing the entrance of the chamber before transferring the workpiece from the chamber to the second station. The method can also include lowering a pressure in the chamber before opening the exit of the chamber for transferring the workpiece from the chamber to the second station. The method can also include establishing a recirculating gas flow in the second station. The method can also include cooling the environment of the second station. The method can also include establishing a curtain flow at the exit of the chamber.

In some embodiments, the method can include establishing two environments with different cleanliness levels interfacing a cleaning chamber; transferring a workpiece from the dirtier environment to the cleaning chamber for cleaning; transferring the workpiece from the cleaning chamber to the cleaner environment, wherein the two environments are isolated from each other during the transfer of the workpiece.

The above description describes a cleaning chamber between two dirty and cleaned environments. However, the present invention is not so limited, and can be equally applied to any processing chamber requiring a level of cleanliness established by separating the input dirty with the output cleaned environments.

Further, the cleaner system and method of cleaning a workpiece can include other features, such as the features described in other sections. For example, the features can include separate cleaning chambers, gripper arms for picking and placing different components using a same robot handler, gripper arms for holding different components at different locations, horizontal spin cleaning and drying for outer container, hot water and hot air cleaning process, vertical nozzles and rasterizing megasonic nozzles for cleaning with hot air nozzles for drying, vacuum decontamination chambers for outgassing different components, and purge gas loading and unloading station.

In an embodiment, the present invention discloses separate cleaning chambers for different components of an object. The separation can prevent contamination of cleaner components by dirtier components during the cleaning process. For example, the inner container of a double container euv reticle carrier is cleaner than the corresponding outer container, since it has been designed to be protected by both the outer container and an inert gas ambient. Thus separate cleaning chambers for the outer container components and for the inner container components can minimize the contamination of the inner container, for example, by the outer container during cleaning if the inner and outer components are cleaned together.

In an embodiment, the number of cleaning chambers is determined based on the levels of cleanliness. For example, a double container carrier can have two levels of cleanliness: a dirtier level for the outer container and a cleaner level for the inner container. Thus two separate cleaning chambers can be used. A first cleaning chamber is used for cleaning the outer container of a double container carrier, including the upper lid and the lower support of the outer container. A second cleaning chamber is used for cleaning the inner container of a double container carrier, including the upper lid and the lower support of the inner container.

In an embodiment, the levels of cleanliness can be further refined. For example, four levels of cleanliness can be established, generating two cleanliness levels for each outer and inner container, since the upper lid and the lower support of a container can attract different levels of contamination. Thus four separate cleaning chambers can be used. First and second cleaning chambers are used for cleaning the upper lid and the lower support of the outer container of a double container carrier, respectively. Third and fourth cleaning chambers are used for cleaning the upper lid and the lower support of the inner container of a double container carrier, respectively.

In an embodiment, each component of the object is cleaned separately in separate cleaning chambers. For example, a double container carrier can be cleaned in four separate cleaning chambers, one for upper lid of outer container, one for lower support for outer container, one for upper lid of inner container, and one for lower support for inner container.

Figure 8A:
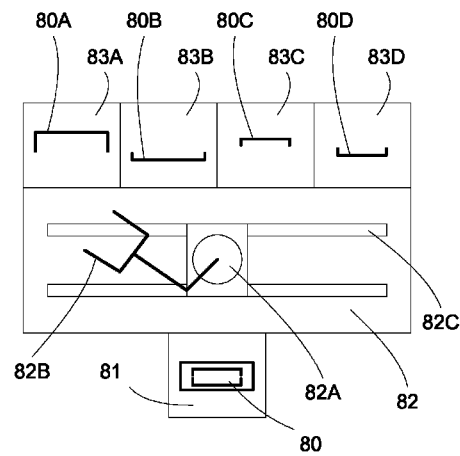
FIGS. 8A-8B illustrate exemplary separate cleaning chambers for different components of an object according to an embodiment of the present invention.
Figure 8B:
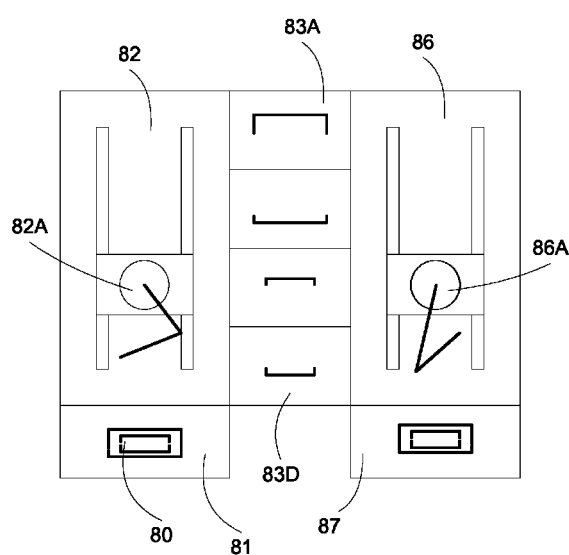

FIGS. 8A-8B illustrate exemplary separate cleaning chambers for different components of an object according to an embodiment of the present invention. In FIG. 8A, four different cleaning chambers 83A-83D are disposed next to each other for cleaning different components of an object, for example, the four components 80A-80D of a double container carrier 80. A carrier 80 is loaded to a loading station 81, and then the components are picked up by the robot 82A having gripper arms 82B in a transfer station 82. The robot 82A can travel between the multiple cleaning chambers 83A-83D, for example, by a linear guide 82C.

In FIG. 8B, the cleaning chambers 83A-83D separate the input dirty environment 82 from the output cleaned environment 86, thus providing an additional level of cleanliness for the objects to be cleaned. An object, such as a double container carrier 80, is loaded to an input loading station 81, and is transferred by a robot 82A to the dirty environment 82. From there, the components of the carrier 80 are placed to different cleaning chambers 83A-83D, to be cleaned separately. After being cleaned, a cleaned robot 86A picks up the components, places into the cleaned environment 86, and to the output unloading station 87.

Figure 9:
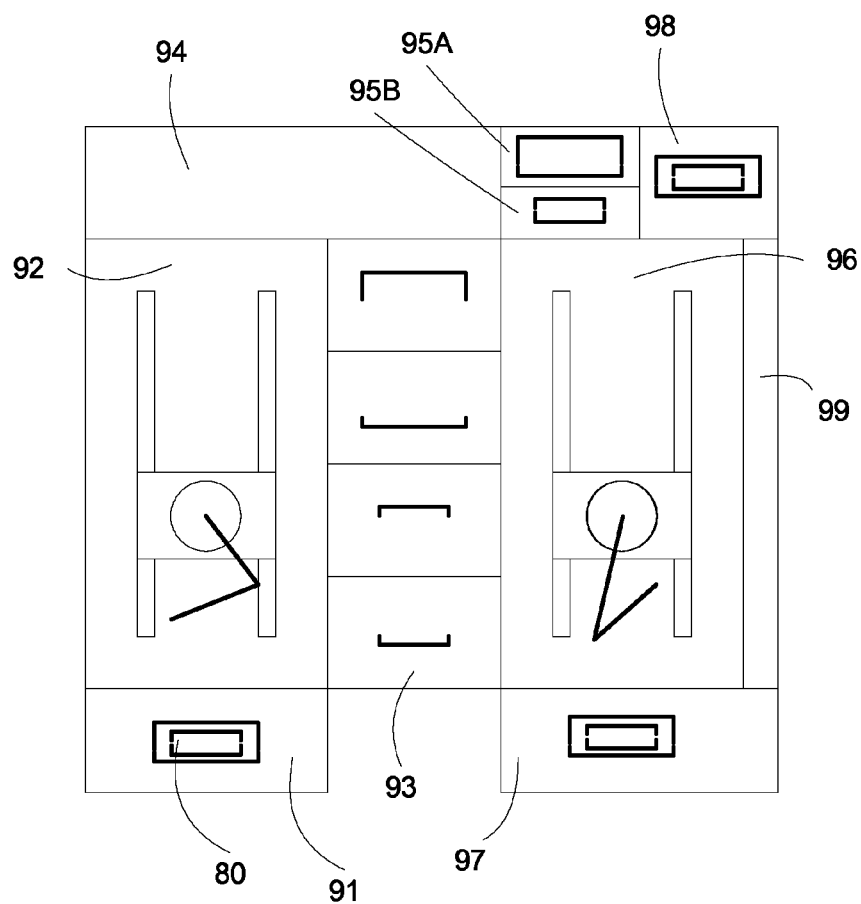
FIG. 9 illustrates an exemplary cleaner system using separate cleaning chambers for different components of an object according to an embodiment of the present invention

FIG. 9 illustrates an exemplary cleaner system using separate cleaning chambers for different components of an object according to an embodiment of the present invention. An object, such as a double container carrier 80, is loaded to an input loading station 91, and is transferred by a robot to the dirty environment 92. From there, the components of the carrier 80 are placed to different cleaning chambers 93, to be cleaned separately. After being cleaned, a cleaned robot picks up the components to bring to the cleaned environment 96. Optional outgassing chambers 95A-95B can be included to outgas the components before assembling the components in an assembling station 98. After being assembled, the assembled carrier is outputted to the output unloading station 97.

In an embodiment, the present invention discloses separate outgassing chambers 95A and 95B for decontaminating the components after being cleaned. Four outgassing chambers can be used. Preferably, two outgassing chambers are used, one for inner container components and one for outer container components. For outgassing decontamination, the levels of cleanliness can be accomplished by using two outgassing chambers, in combination with four cleaning chambers for different parts of the inner and outer containers. Details for the outgassing chamber will be described in later sections.

In an embodiment, the present invention discloses an assembling station 98 for assembling the components together after being cleaned and outgassing decontaminated separately. The assembling station preferably comprises a clean environment, as clean as the cleaned environment 96, or even cleaner. For example, the assembling station can be filled with nitrogen, to ensure that the volume inside the carrier is filled with nitrogen, thus preventing any oxygen for potential oxidation or bacterial growth. Details for the assembling station will be described in later sections.

In some embodiments, the present invention discloses a system for cleaning a workpiece, wherein the workpiece comprises a first component and a second component, wherein the first component surrounds the second component. The first component can be an outer box, made of a polymer material, and including a lid and a body portions. The second component can be an inner box, made of a metallic material, and including a lid and a body portions. The system can include a first chamber, wherein the first chamber is operable to clean the first component, a second chamber, wherein the second chamber is operable to clean the second component, a first station, wherein the first station is coupled to the first and second chambers, wherein the first station comprises a first robotic mechanism, wherein the first robotic mechanism is operable to transfer the first component from the first station to the first chamber and to transfer the second component from the first station to the second chamber.

In some embodiments, the first component comprises a lid and a body, and wherein the first chamber is operable to clean both the lid and the body. The first component can include a lid and a body, and wherein the first chamber can include a first lid chamber operable to clean the lid and a first body chamber operable to clean the body. The second component can include a lid and a body, and wherein the second chamber is operable to clean both the lid and the body. The second component can include a lid and a body, and wherein the second chamber can include a second lid chamber operable to clean the lid and a second body chamber operable to clean the body. The first chamber can include a first entrance and a first exit, wherein the second chamber can include a second entrance and a second exit, wherein the first station is coupled to the first and second entrances, wherein the system further can include a second station, wherein the second station is coupled to the first and second exits, wherein the second station can include a second robotic mechanism, wherein the second robotic mechanism is operable to transfer the first component from the first chamber to the second station and to transfer the second component from the second chamber to the second station. The first station can be isolated from the second station. The system can further include a load port coupled to the first station for accepting a workpiece; one or more third chambers, wherein the third chambers are operable to enable outgassing the first and second components after cleaning; and a fourth chamber, wherein the fourth chamber is operable to enable assembling of the first and second components after cleaning.

Figure 10A:
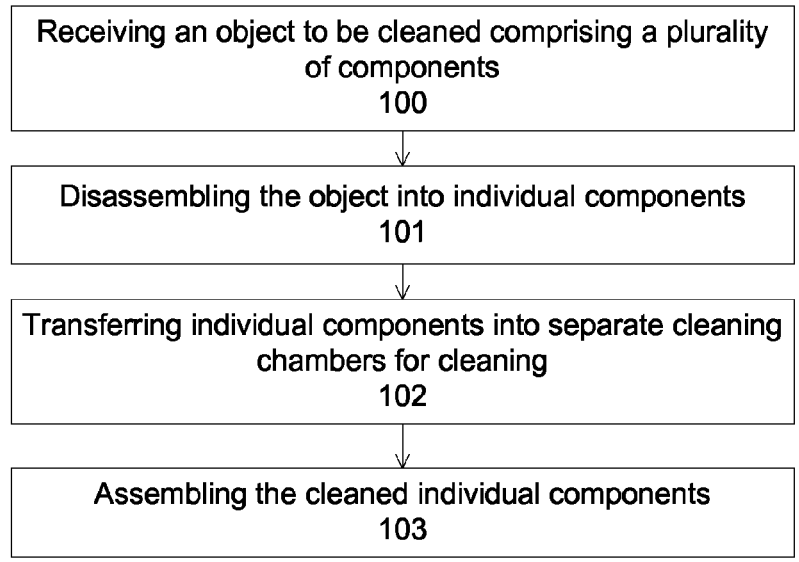
FIGS. 10A-10B illustrate exemplary flowcharts for cleaning objects using separate cleaning chambers according to an embodiment of the present invention.
Figure 10B:
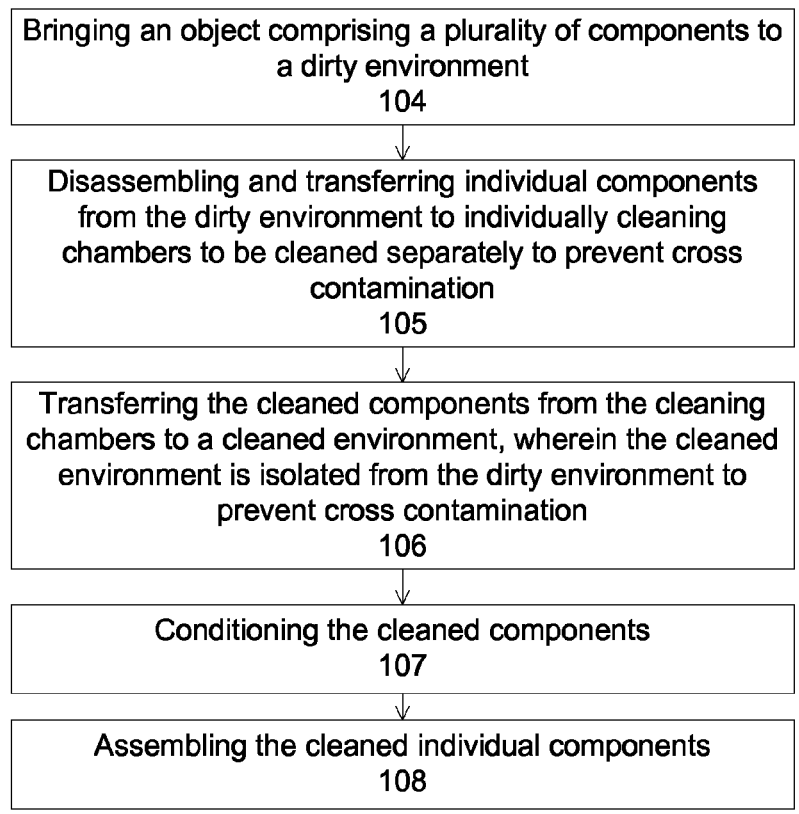

FIGS. 10A-10B illustrate exemplary flowcharts for cleaning objects using separate cleaning chambers according to an embodiment of the present invention. In FIG. 10A, operation 100 receives an object to be cleaned comprising a plurality of components, such as a double container carrier. Operation 101 disassembles the object into individual components. For example, a double container carrier can be disassembled into an outer container and an inner container. Alternatively, the double container carrier can be disassembled into a lid and a support of the outer container and into a lid and a support of the inner container. Operation 102 transfers individual components into separate cleaning chambers for cleaning. Operation 103 assembles the cleaned individual components, preferably in cleaned ambient to preserve the cleanliness. The assembling station is thus preferably integrated with the multiple cleaning chambers to maintain the cleanliness level.

In FIG. 10B, separate environments are implemented together with separate cleaning chambers. Operation 104 brings an object comprising a plurality of components to a dirty environment. Operation 105 disassembles and transferring individual components from the dirty environment to individually cleaning chambers to be cleaned separately to prevent cross contamination. Operation 106 transfers the cleaned components from the cleaning chambers to a cleaned environment, wherein the cleaned environment is isolated from the dirty environment to prevent cross contamination. Operation 107 conditions the cleaned components. For example, the cleaned components can undergo vacuum decontamination, to remove trapped gas within the components. Operation 108 assembles the cleaned individual components.

Figure 11:
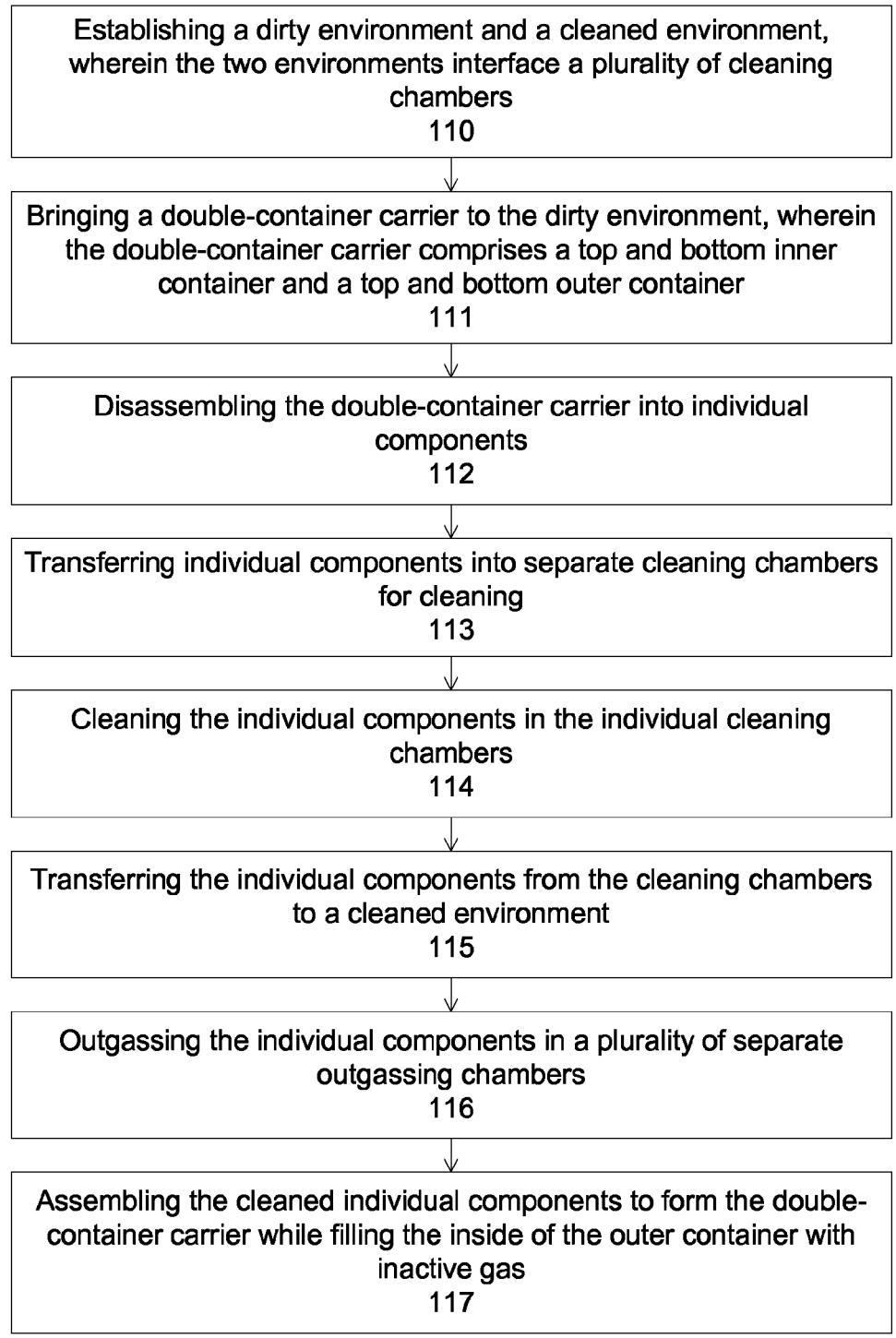
FIG. 11 illustrates an exemplary flowchart for separately cleaning objects using separate cleaning chambers according to an embodiment of the present invention.

FIG. 11 illustrates an exemplary flowchart for separately cleaning objects using separate cleaning chambers according to an embodiment of the present invention. Operation 110 establishes a dirty environment and a cleaned environment, wherein the two environments interface a plurality of cleaning chambers. Operation 111 brings a double-container carrier to the dirty environment, wherein the double-container carrier comprises a top and bottom inner container and a top and bottom outer container. Operation 112 disassembles the double-container carrier into individual components. Operation 113 transfers individual components into separate cleaning chambers for cleaning. Operation 114 cleans the individual components in the individual cleaning chambers. Operation 115 transfers the individual components from the cleaning chambers to a cleaned environment. Operation 116 outgases the individual components in a plurality of separate outgassing chambers. Operation 117 assembles the cleaned individual components to form the double-container carrier while filling the inside of the outer container with inactive gas.

In some embodiments, the present invention discloses a method for cleaning a workpiece, wherein the workpiece comprises a first component and a second component, wherein the first component surrounds the second component. The method can include transferring the first component of a workpiece from a first station to a first chamber; transferring the second component of the workpiece from the first station to a second chamber; cleaning the first and second components in the first and second chambers.

In some embodiments, the method can further include transferring the first component from the first chamber to a second station through the first exit; transferring the second component from the second chamber to a second station through the second exit; transferring the first and second components outgassing the first and second components after cleaning; and transferring the first and second components to a fourth chamber, wherein the fourth chamber is operable to assemble the first and second components.

Further, the cleaner system and method of cleaning a workpiece can include other features, such as the features described in other sections. For example, the features can include separate environments, gripper arms for picking and placing different components using a same robot handler, gripper arms for holding different components at different locations, horizontal spin cleaning and drying for outer container, hot water and hot air cleaning process, vertical nozzles and rasterizing megasonic nozzles for cleaning with hot air nozzles for drying, vacuum decontamination chambers for outgassing different components, and purge gas loading and unloading station.

In an embodiment, the present invention discloses a robot arm to handle the object to be cleaned. A single robot handler can be used to handle all components of the object. Alternatively, multiple robot handlers can be used. In an embodiment, a gripper handler with adjustable gripper arms is used to handle all different sizes of the components of the double container carrier. For example, since the outer container is larger than the inner container, the gripper arm can be enlarged to handle the outer container and reduced to handle the inner container. Thus a single robot handler having gripper arms can be used to handle all different components of an object.

In an embodiment, the robot handler is further designed to avoid cross contamination between the components of the object by contacting different components having different cleanliness levels with different parts of the robot handler. For example, the gripper arms grip different components at different locations of the gripper arms. A top portion of the gripper arms can be used to support the outer container portion. A middle portion of the gripper arms can be used to support the inner container portion.

In an embodiment, the robot handler is further designed to minimize particle generation. For example, the gripper arms are controlled to grip the components with minimum force to minimize friction which can generate particles. Instead of using pneumatic control, motor control, with or without feedback sensor, can be used to control the forces generated by the gripper arms when holding the carrier components.

Figure 12A:
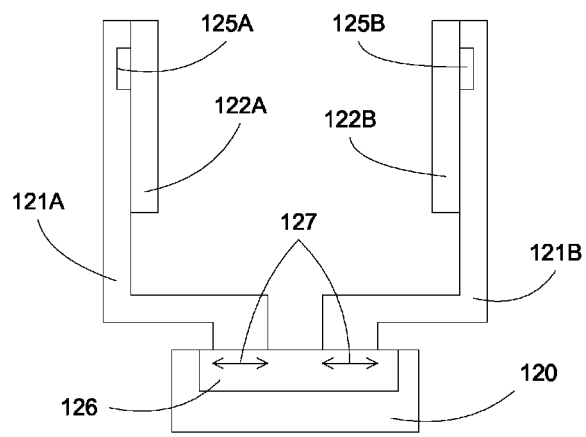
FIGS. 12A-12B illustrate an exemplary robot gripper according to an embodiment of the present invention.
Figure 12B:
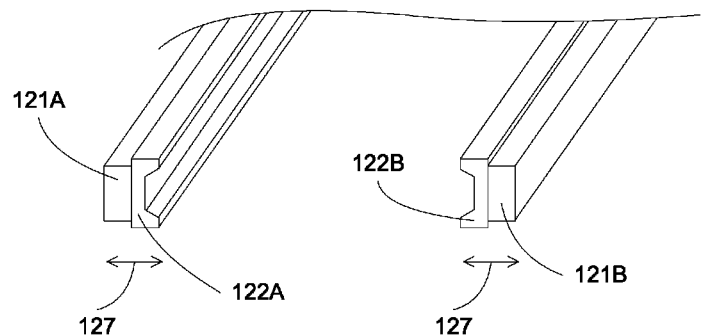

FIGS. 12A-12B illustrate an exemplary robot gripper according to an embodiment of the present invention. The robot gripper comprises two gripper arms 121A and 121B coupled to a handler 120. A movement mechanism 126, such as a motor, can move 127 the gripper arms, for enlarging or narrowing the grip of the gripper arms to accommodate different sizes of objects. The motor can have a controller component, such as a current sensor (built in the motor, not shown) or pressure sensors 125A/125B to control the forces from the gripper arms on the object to be gripped. Optional inserts 122A/122B can be included for further reducing the particle generation due to friction.

Figure 13A:
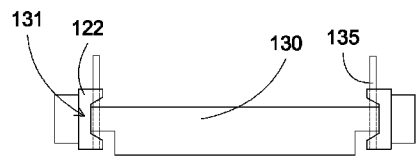
FIGS. 13A-13C illustrate exemplary gripping configurations of the gripper arms according to an embodiment of the present invention.
Figure 13B:
Figure 13C:
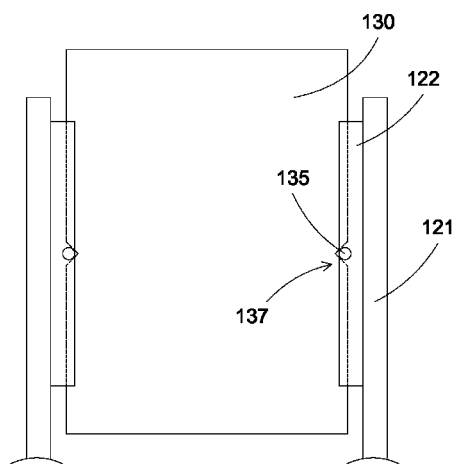

FIGS. 13A-13C illustrate exemplary gripping configurations of the gripper arms according to an embodiment of the present invention. In FIG. 13A, the gripper arms 121 support a component 130 of an inner container (an upper lid, for example) from the middle portion 131 of the gripper arm inserts 122. Pins 135 can be used to lock the component 130, by mating with a recess 137 of the component 130 (see FIG. 13C). In FIG. 13B, the gripper arms 121 support a component 132 of an outer container (an upper lid, for example) from the top portion 133 of the gripper arm inserts 122. Pins 135 can be used to lock the component 133, by mating with a recess of the component (not shown, but similar to FIG. 13C). The gripper arms thus grip different components of the objects at different locations (middle portion 131 and top portion 133), thus can minimize cross contamination between different components having different levels of cleanliness. Other configurations can be used, such as gripper arm supporting a component from the bottom of the insert, or the gripper arm supporting a component directly by the gripper arm without the insert.

In some embodiments, the present invention discloses a robot handler for holding a workpiece, wherein the workpiece comprises a first component and a second component, wherein the first component surrounds the second component. The robot handler can include a handle, wherein the handle comprises two arms, wherein the distance between the two arms is adjustable to support the first and the second components; a mechanism coupled to the two arms to adjust the distance between the two arms; wherein each arm comprises a first portion for gripping the first component and a second portion for gripping the second component, wherein the first portion and the second portion are disposed on different locations on the arm.

In some embodiments, the mechanism can include a motor. The first portion can include a middle portion of the arm. The second portion can include a top or bottom portion of the arm. The robot handler can further include a feedback sensor for controlling the force acting on the first or second components. The robot handler can include an insert coupled to the arm, wherein the first portion comprises a middle portion of the insert. The robot handler can include an insert coupled to the arm, wherein the second portion comprises a top or bottom portion of the insert. The robot handler can include a pin for mating with a recess on the first or second component.

Figure 14A:
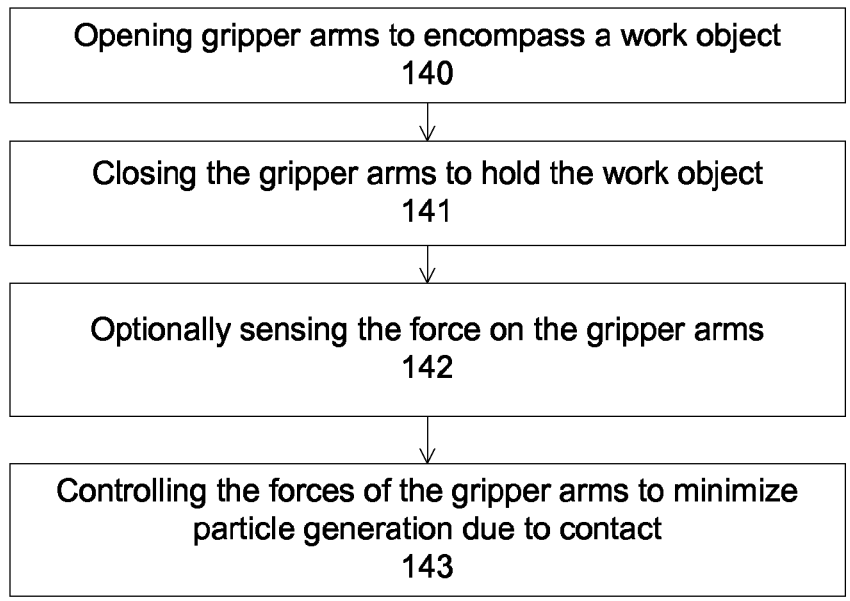
FIGS. 14A-14B illustrate exemplary flowcharts for gripping objects using the present gripper arms according to an embodiment of the present invention.
Figure 14B:
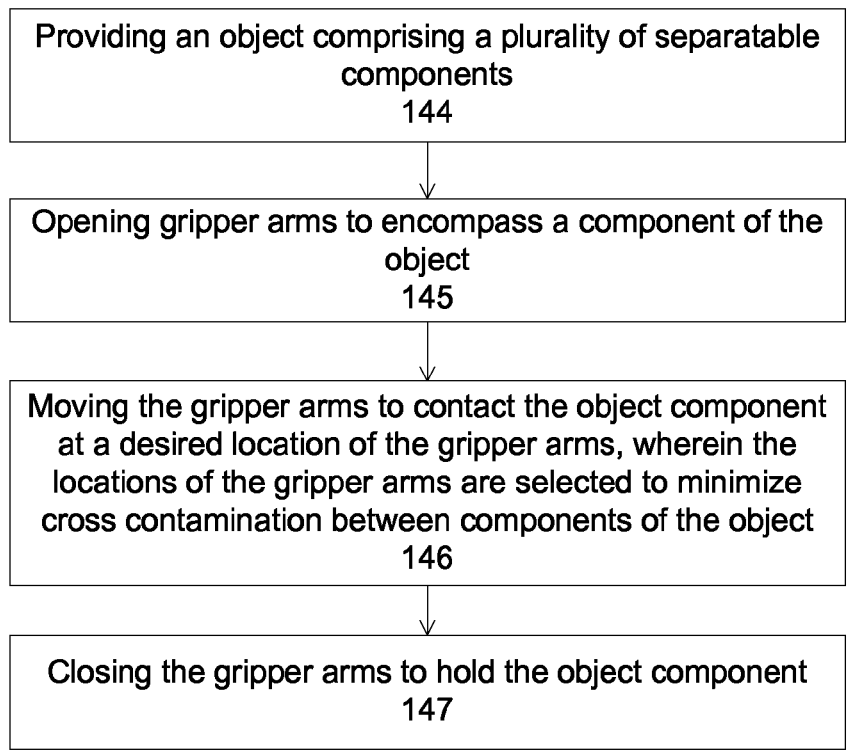

FIGS. 14A-14B illustrate exemplary flowcharts for gripping objects using the present gripper arms according to an embodiment of the present invention. In FIG. 14A, operation 140 opens gripper arms to encompass a work object. Operation 141 closes the gripper arms to hold the work object. Operation 142 optionally senses the force on the gripper arms. Operation 143 controls the forces of the gripper arms to minimize particle generation due to contact.

In FIG. 14B, operation 144 provides an object comprising a plurality of separable components. Operation 145 opens gripper arms to encompass a component of the object. Operation 146 moves the gripper arms to contact the object component at a desired location of the gripper arms, wherein the locations of the gripper arms are selected to minimize cross contamination between components of the object. Operation 147 closes the gripper arms to hold the object component.

Figure 15:
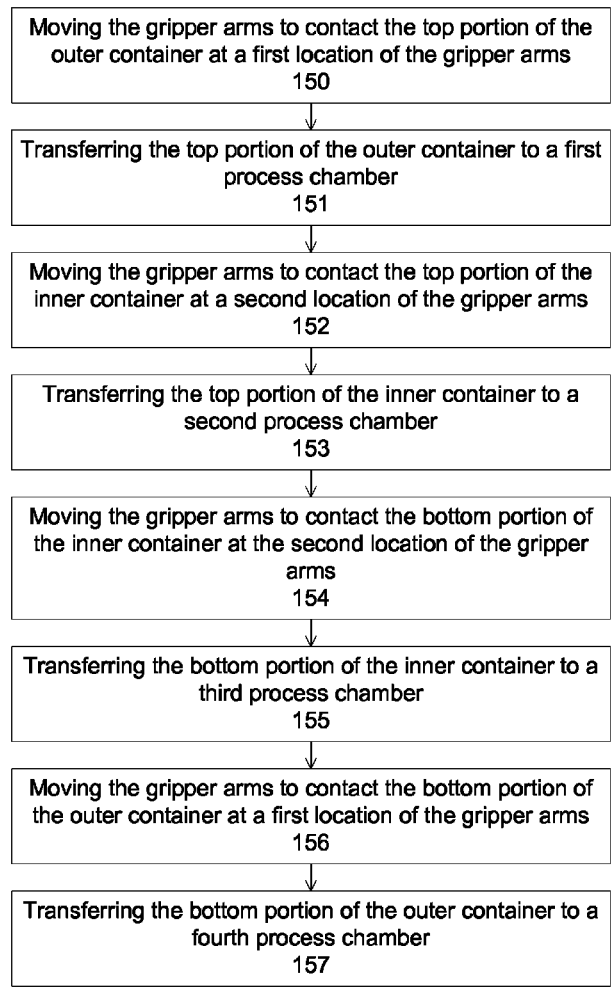
FIG. 15 illustrates an exemplary flowchart for separately cleaning objects using separate cleaning chambers according to an embodiment of the present invention.

FIG. 15 illustrates an exemplary flowchart for separately cleaning objects using separate cleaning chambers according to an embodiment of the present invention. Operation 150 moves the gripper arms to contact the top portion of the outer container at a first location of the gripper arms. Operation 151 transfers the top portion of the outer container to a first process chamber. Operation 152 moves the gripper arms to contact the top portion of the inner container at a second location of the gripper arms. Operation 153 transfers the top portion of the inner container to a second process chamber. Operation 154 moves the gripper arms to contact the bottom portion of the inner container at the second location of the gripper arms. Operation 155 transfers the bottom portion of the inner container to a third process chamber. Operation 156 moving the gripper arms to contact the bottom portion of the outer container at a first location of the gripper arms. Operation 157 transfers the bottom portion of the outer container to a fourth process chamber.

In some embodiments, the present invention discloses a method for transferring a workpiece, wherein the workpiece comprises a first component and a second component, wherein the first component surrounds the second component. The method can include enlarging a first distance between two gripper arms to encompass the first component; gripping the first component at a first portion on the gripper arms; transferring the first component to a first destination; enlarging a second distance between two gripper arms to encompass the second component; gripping the second component at a second portion on the gripper arms; transferring the second component to a second destination, wherein the first portion and the second portion are disposed on different locations on the arm.

In some embodiments, the enlarging and gripping can be performed by a motor. The method can further include mating a pin on the arm with a recess on the first or second component.

In some embodiments, the robot handler can be used in transferring a workpiece that has a first component surrounding a second component. The robot handler can be used in other configurations described in the present description.

In an embodiment, the present invention discloses different cleaning chambers for cleaning different components of an object. To clean the object, a plurality of liquid nozzles can be directed toward the object surfaces. The liquid nozzles can deliver mixtures of cleaning liquid, rinsing liquid (such as DI water), and other chemical liquid designed for cleaning and decontaminating the object, such as surfactant or metal removal agent. Ultrasonic or megasonic nozzles can deliver energetic liquid to improve the cleaning power. The amount of liquid can be carefully controlled, such as spraying with fine droplets and aerosol gas bubbles together with carrier gas (such as nitrogen, air or inert gas). The liquid nozzles can also be configured to deliver gas, such as nitrogen or filtered air, or gas/liquid mixtures. Fast evaporating liquid can be used, such as alcohol with low boiling temperature and high vapor pressure. Hot carrier gas and hot liquid can also be utilized, for example, to assist in fast drying by evaporation. In addition, the chamber and the positioning of the object can be designed so that the liquid can be removed by good drainage with no liquid retention and no liquid dead spots. Further, the liquid vapor can be removed by fast exhaust and low chamber pressure, for example, by purging with dry gas and/or by maintaining a vacuum pressure inside the cleaning chamber during the liquid cleaning cycle.

The nozzles can be designed to overlap the surface, providing a complete coverage of the surface to ensure complete cleaning. The nozzles can provide a small angle flow, for example, to have adequate cleaning force. The angle of impact can be perpendicular to the surface for greater force, or can be along the surface for higher surface coverage. In an aspect, the object to be cleaned is a semiconductor container, thus contamination tends to be small particulates or metal contamination, and the present invention discloses cleaning nozzles having medium pressure and low angle of impact of cleaning for higher coverage area.

In a typical cleaning process, cleaning liquid, such as cleaning solution, is sprayed onto the object, such as the reticle carrier components. Additives, such as surfactant, detergent, or contamination/metal removal agents may be added into the water or other liquid, for example, by aspiration or pumping. The contamination/metal removal agent can be a metal removal agent such as a chelating agent. A high alkaline detergent may be used in place of the surfactant. UV light can be added, for example, to aid removal of contamination. After completing cleaning and/or contamination removal, the object is then rinsed by spraying with a rinsing liquid, such as DI water. Cyclic cleaning/rinsing processes can be performed for effective cleaning. The cleaning liquid can be collected for recycling.

In an embodiment, the cleaning process provides small liquid droplets to aid in the subsequent drying process. In addition, purged gas or liquid spray can be provided to break droplets into even smaller ones. In the areas where the liquid is consolidated, for example, at the bottom of the surfaces, gas or liquid spray can be provided to break the large, consolidated liquid into small droplets, such as blowing the liquid away.

In an embodiment, the liquid can be heated to increase the volatility, adding in the ease of liquid residue removal. In addition, the object and the process chamber can also be heated, for example, by IR or UV lamps.

In the cleaning chamber, the object can be positioned so that the liquid can run down by gravity. After liquid cleaning, the object can be dried by gas flow, for example, gas nozzles providing nitrogen, filtered air, liquid or aerated liquid, can be directed toward the object to help remove liquid residue trapped by surface tension. For example, a bottom gas nozzle can be directed toward the bottom of the object, in addition to a top gas nozzle can be directed toward the top surface, and other gas nozzles directed toward irregular shapes of the object where liquid residue can be trapped. Additionally, spin drying can be used.

In some embodiments, the present invention discloses a system for cleaning a workpiece. The system can include a chamber; one or more first nozzles, wherein the first nozzles are operable to deliver a cleaning liquid; one or more second nozzles, wherein the second nozzles are operable to deliver a megasonic liquid; one or more third nozzles, wherein the third nozzles are operable to deliver a drying gas; a first mechanism for moving the second nozzles in a first direction; a second mechanism for moving the workpiece in a second direction, wherein the second direction is different from the first direction.

In some embodiments, the first direction can be horizontal and the second direction can be vertical. The second nozzles can move cyclically from one side of the workpiece to an opposite side of the workpiece. The workpiece can move vertically. The third nozzles can be disposed above the first nozzles. The second nozzles can be disposed interspersed with the first nozzles.

Figure 16A:
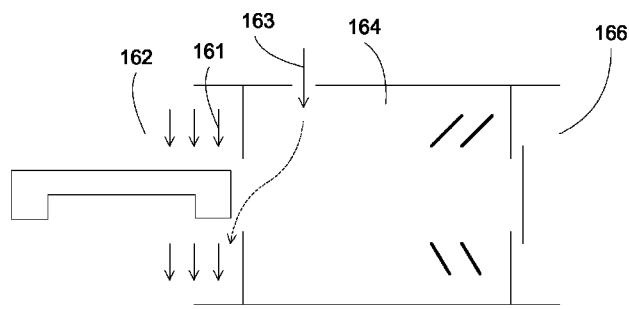
FIGS. 16A-16C illustrate exemplary cleaning sequence of an object according to an embodiment of the present invention.
Figure 16B:
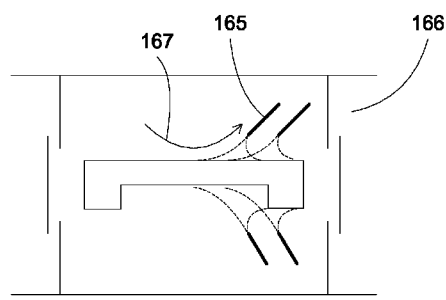
Figure 16C:
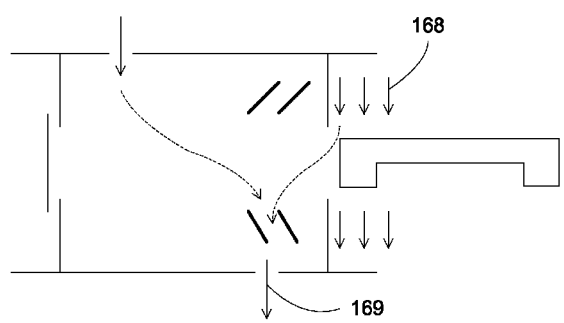

FIGS. 16A-16C illustrate exemplary cleaning sequence of an object according to an embodiment of the present invention. In FIG. 16A, an object, such as an upper lid of an outer container of a double container carrier, is brought from a dirty environment 162 under laminar flow 161 to a cleaning chamber 164. The cleaning chamber is isolated from a cleaned environment 166, for example, by closing access door to the cleaned environment. In addition, purge gas 163 can be provided to the cleaning chamber 164 to prevent contamination back flow from the dirty environment to the cleaning chamber.

In FIG. 16B, the cleaning chamber is isolated, and liquid and gas nozzles 165 can provide liquid and gas to clean the object. The object can be disposed in a horizontal direction, and spin cleaning and drying 167 can be applied to improve the cleaning and drying processes. The nozzles 165 can operate in sequence, for example, delivering liquid for cleaning and subsequently delivering gas for drying. Hot liquid and hot gas can be used. Heaters can be provided to provide thermal energy, assisting in the cleaning and drying process.

In FIG. 16C, the outlet door is open and the object is brought to the cleaned environment 166. Low pressure can be established in the cleaning chamber, for example, through exhaust 169, to prevent any contamination back flow to the cleaned environment. Curtain gas 168 can be used to further minimize the contamination back flow.

Figure 17A:
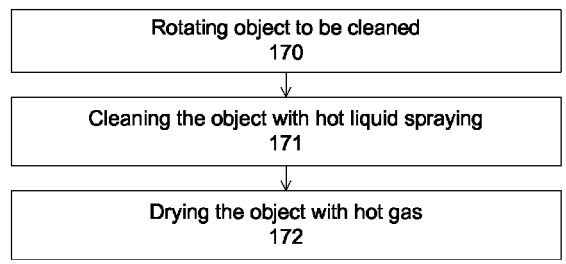
FIGS. 17A-17B illustrate exemplary flowcharts for cleaning objects according to an embodiment of the present invention.
Figure 17B:
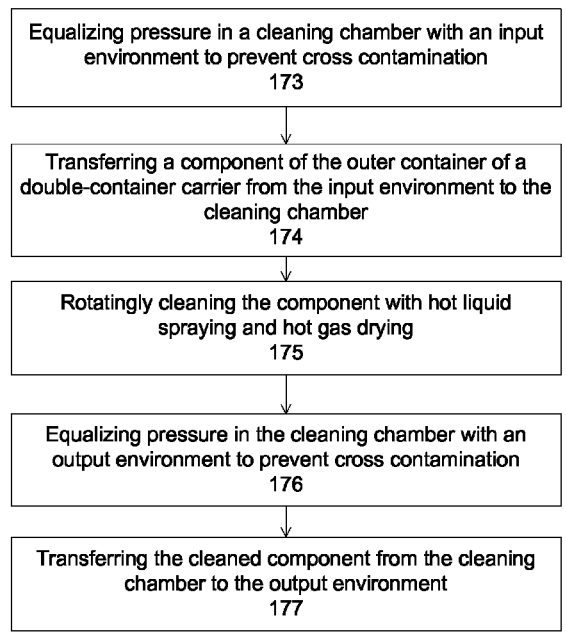
Figure 18A:
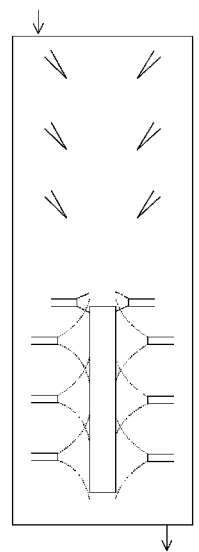
FIGS. 18A-18C and 19A-19B illustrate an exemplary cleaning chamber employing ultrasonic or megasonic liquid spray according to an embodiment of the present invention.
Figure 18B:
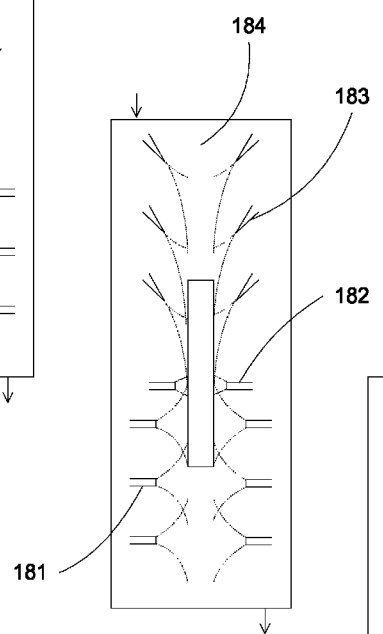
Figure 18C:
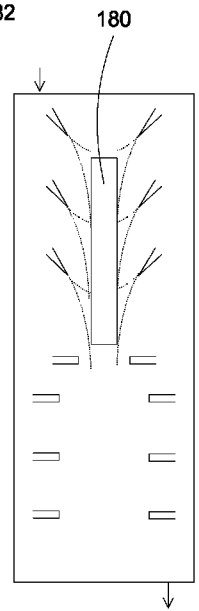
Figures 19A, 19B:
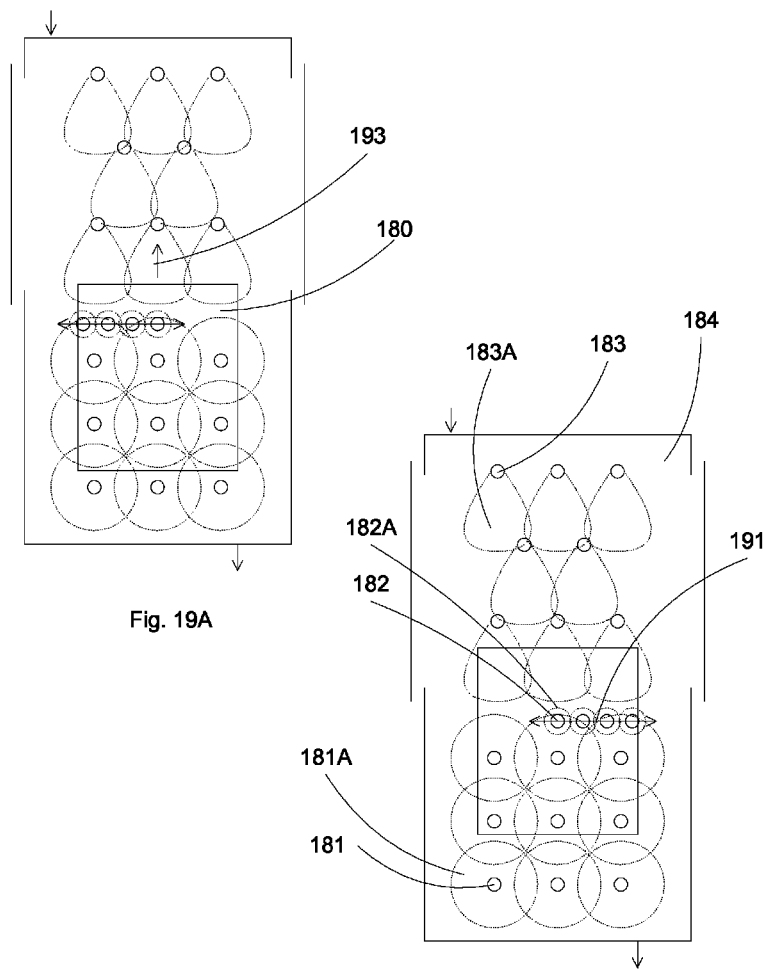

FIGS. 17A-17B illustrate exemplary flowcharts for cleaning objects according to an embodiment of the present invention. In FIG. 17A, operation 170 rotates object to be cleaned. Operation 171 cleans the object with hot liquid spraying. Operation 172 dries the object with hot gas. Operation 173 equalizes pressure in a cleaning chamber with an input environment to prevent cross contamination. In FIG. 17B, operation 174 transfers a component of the outer container of a double-container carrier from the input environment to the cleaning chamber. Operation 175 rotatingly cleans the component with hot liquid spraying and hot gas drying. Operation 176 equalizes pressure in the cleaning chamber with an output environment to prevent cross contamination. Operation 177 transfers the cleaned component from the cleaning chamber to the output environment.

In an embodiment, the present invention discloses a novel cleaning chamber and process to clean components that require high level of cleanliness, such as the inner container of a double container carrier. The cleaning chamber employs rasterizing ultrasonic or megasonic liquid spray to clean the object. In an embodiment, the ultrasonic or megasonic nozzles travel in a horizontal direction while the object travels in a vertical direction, thus covering all surface areas of the object with the spray from the ultrasonic or megasonic nozzles. In addition, liquid spray can be used for preclean, and drying nozzles can be used for drying.

FIGS. 18A-18C and 19A-19B illustrate an exemplary cleaning chamber employing ultrasonic or megasonic liquid spray according to an embodiment of the present invention. An object is brought in to a cleaning chamber 184, preferably in a vertical direction and from a top portion of the cleaning chamber. The object is then brought to a bottom portion, and then slowly raised back 183 to the top portion, as shown in the sequence in FIGS. 18A-18C and 19A-19B. At the bottom portion, liquid nozzles 181 deliver liquid to the object 180 for cleaning. Liquid nozzles 181 are preferably disposed a distance from the object, thus spraying at the object surface through a large area 181A. Ultrasonic or megasonic nozzles 182 clean the top portion of the object, and with the object slowly raised up, nozzles 182 continuously clean the whole object surface. In addition, the ultrasonic or megasonic nozzles move in a horizontal direction 191, thus can clean the object in a horizontal direction. The ultrasonic or megasonic nozzles are preferably disposed close to the object for effective cleaning, thus spraying at the object surface through a small area 182A. With the rasterizing action, including horizontal movement 191 of the ultrasonic or megasonic nozzles, and the vertical movement 193 of the object, the ultrasonic or megasonic spray can cover the whole surface of the object, providing an effective cleaning process.

Above the ultrasonic or megasonic nozzles are a number of drying nozzles 183, pointing down at the object for drying the object and for blowing down the liquid. The drying nozzles 183 can be disposed to deliver a downward area 183A. Hot liquid and hot gas, together with heaters can be used. The combination of liquid spray, ultrasonic or megasonic liquid spray, and drying spray can clean the object with high level of cleanliness.

Figure 20A:
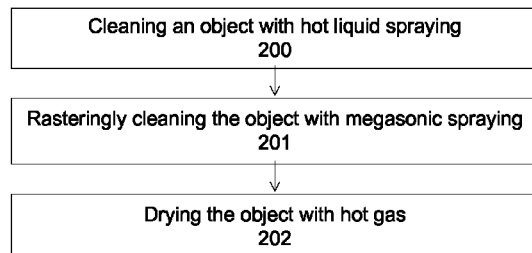
FIGS. 20A-20B illustrate exemplary flowcharts for cleaning objects according to an embodiment of the present invention.
Figure 20B:
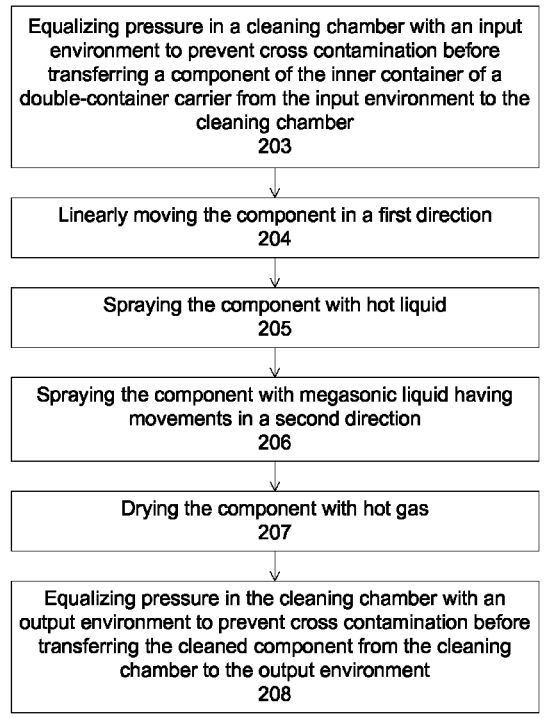

FIGS. 20A-20B illustrate exemplary flowcharts for cleaning objects according to an embodiment of the present invention. In FIG. 20A, operation 200 cleans an object with hot liquid spraying. Operation 201 rasterizingly cleans the object with megasonic spraying. Operation 202 dries the object with hot gas. In FIG. 20B, operation 203 equalizes pressure in a cleaning chamber with an input environment to prevent cross contamination before transferring a component of the inner container of a double-container carrier from the input environment to the cleaning chamber. Operation 204 linearly moves the component in a first direction. Operation 205 sprays the component with hot liquid. Operation 206 sprays the component with megasonic liquid having movements in a second direction. Operation 207 dries the component with hot gas. Operation 208 equalizes pressure in the cleaning chamber with an output environment to prevent cross contamination before transferring the cleaned component from the cleaning chamber to the output environment.

In some embodiments, a method for cleaning a workpiece can include providing a workpiece in a cleaning chamber; moving the workpiece in a first direction; spraying the workpiece with a cleaning liquid; spraying the workpiece with a megasonic liquid, wherein the megasonic liquid comprises movement in a second direction, wherein the second direction is different from the first direction; spraying the workpiece with a drying gas. The megasonic nozzles can move cyclically from one side of the workpiece to an opposite side of the workpiece. The drying gas can be spraying above the cleaning liquid and the megasonic liquid. The cleaning liquid can be spraying interspersed with the megasonic liquid. The method can further include equalizing the pressure in the cleaning chamber before transferring the workpiece to the cleaning chamber, and/or equalizing the pressure in the cleaning chamber before transferring the workpiece out of the cleaning chamber.

In an embodiment, the present invention discloses a decontamination chamber to decontaminate the components after cleaning. The decontamination can employ a vacuum chamber, with high vacuum preferred, for example, less than $10^{-3}$ Torr, or preferably less than $10^{-6}$ Torr. The vacuum chamber can accelerate the outgassing of the components, removing any trapped gas within the components.

The vacuum chamber can be designed to provide configurations with effective pumping and high pumping conductance. The vacuum chamber can further comprise a heating mechanism, such as IR heaters or chamber wall heaters. The heaters can be heated to between 40 and 90 C, and preferably at about 70 C. The heating temperature depends on the materials, for example, low temperature of less than 100 C is preferred for polymer materials, and high temperature of above 100 C can be used for metal.

In an embodiment, outgassing monitoring sensors, such as residue gas analysis (RGA), can be provided to measure the release of contaminants within the vacuum chamber, which then can be used to monitor the decontamination process.

In an embodiment, inert purge gas is provided inside vacuum chamber, such as nitrogen gas, to back fill any gap left by the outgassing contaminants. Cyclic pressuring and vacuuming can be performed, outgassing the contaminants and then back filling with inert gas.

In an embodiment, after decontaminate the components with high vacuum, the chamber is pressurized with nitrogen before opening, effectively coating the surfaces (and filling the sub-surfaces) of the components with nitrogen molecules, further improving the cleanliness and preventing adhering particulates.

Figure 21A:
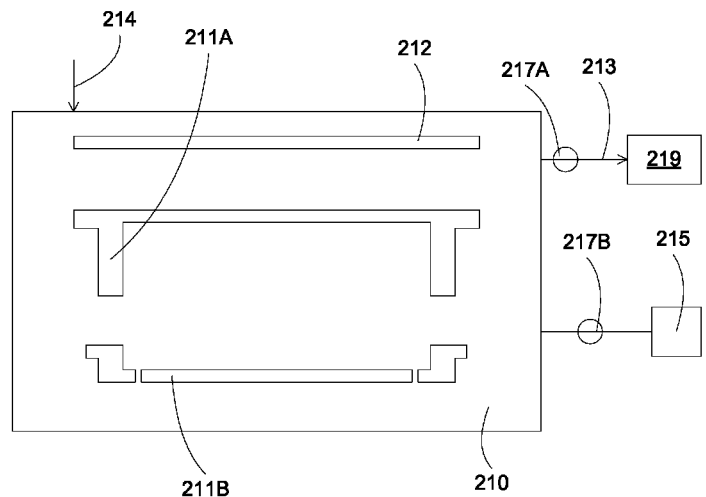
FIG. 21A illustrates an exemplary decontamination chambers according to an embodiment of the present invention.

FIG. 21A illustrates an exemplary decontamination chambers according to an embodiment of the present invention. Vacuum chamber 210 comprises a vacuum line 213 connected to a vacuum pump 219, such as a turbo pump or a cryo pump, creating a high vacuum within the chamber 210. A shut off valve 217A can be provided to isolate the vacuum pump line. Heater 212 is disposed in the vacuum chamber for heating the chamber and the components 211A and 211B. Sensors 215, such as a RGA for monitoring the outgassing species, can be included. A shut off valve 217B can be provided to isolate the gas monitor, e.g., sensor 215. Purge gas 214 can provide an inert ambient to the vacuum chamber, for example, to prevent back flowing of contamination before transferring the components to the outside. A direct connection of the gas monitor 215 to the decontamination chamber can be used if the components does not outgassing too much. For example, for the inner box, which is made of a metallic material, the outgassing contaminant can be much less than polymer materials.

Figure 21B:
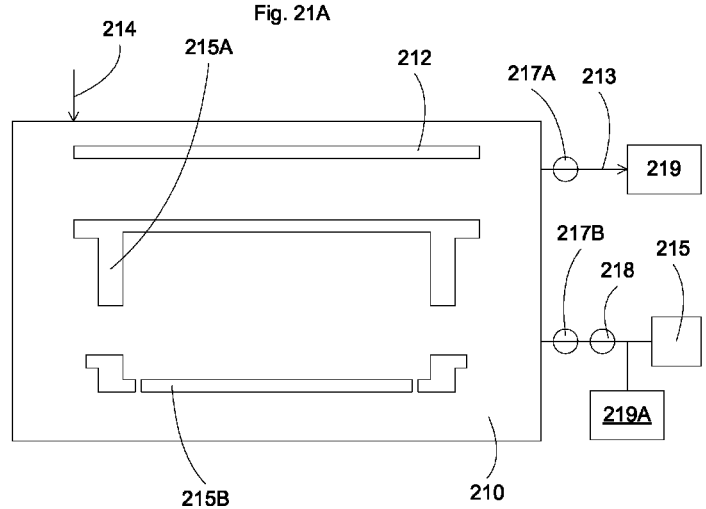
FIG. 21B illustrates another exemplary decontamination chambers according to an embodiment of the present invention.

FIG. 21B illustrates another exemplary decontamination chambers according to an embodiment of the present invention. Vacuum chamber 210 comprises a vacuum line 213 connected to a vacuum pump 219, such as a turbo pump or a cryo pump, creating a high vacuum within the chamber 210. A shut off valve 217A can be provided to isolate the vacuum pump line. Heater 212 is disposed in the vacuum chamber for heating the chamber and the components 211A and 211B. Sensors 215, such as a RGA for monitoring the outgassing species, can be included. A shut off valve 217B can be provided to isolate the gas monitor, e.g., sensor 215. Purge gas 214 can provide an inert ambient to the vacuum chamber, for example, to prevent back flowing of contamination before transferring the components to the outside. Another vacuum pump 219A can be connected between the valve 217B and the gas monitor 215, to maintain a vacuum level for the gas monitor. A differential valve 218 can be included between the gas monitor and the chamber. The differential valve can include a small hole (as compared to the diameter of the conduit, so that the conductivity of the differential valve is much less than the conductivity of the conduit), in order to restrict a flow from the chamber to the gas monitor. Thus the contaminants released from the components can be restricted from reaching the gas monitor. A differential valve connection of the gas monitor 215 to the decontamination chamber can be used if the components can be outgassing too much. For example, for the outer box, which is made of a polymer material, the outgassing contaminant can be high, and can saturate the gas monitor if not restricted from reaching the gas monitor.

In some embodiments, a system for cleaning a workpiece can include a first chamber, wherein the first chamber is operable to clean a workpiece, a second chamber, wherein the second chamber comprises a vacuum ambient to outgassing the workpiece after being cleaned; a robotic mechanism for transferring the workpiece between the first chamber and the second chamber.

The system can further include a first vacuum pump coupled to the second chamber; a first shut off valve connected between the first vacuum pump and the second chamber; a gas monitor coupled to the second chamber; a second shut off valve connected between the gas monitor and the second chamber; a differential valve connected between the gas monitor and the second chamber; a second vacuum pump connected between the differential valve and the second chamber; a heater for heating the workpiece in the second chamber; a nozzle for injecting an inactive gas to the second chamber.

In some embodiments, the present invention discloses a system for cleaning a workpiece, wherein the workpiece comprises a first component and a second component, wherein the first component surrounds the second component. The system can include a first chamber, wherein the first chamber is operable for outgassing the first component of the workpiece; a first vacuum pump coupled to the first chamber through a first shut off valve; a first gas monitor coupled to the second chamber through an assembly, wherein the assembly comprises a second shut off valve and a differential valve; a second vacuum pump fluidly connected between the first gas monitor and the assembly, wherein the second monitor is operable to maintain a vacuum ambient at the gas monitor; a second chamber, wherein the second chamber is operable for outgassing the second component of the workpiece; a third vacuum pump coupled to the second chamber through a third shut off valve; a second gas monitor coupled to the second chamber through a fourth shut off valve.

The system can further include a third chamber for cleaning the first component before transferring to the first chamber, and a fourth chamber for cleaning the second component before transferring to the second chamber; and a heater for heating the workpiece in the first or second chamber, and a nozzle for injecting an inactive gas to the first or second chamber.

Figure 22A:
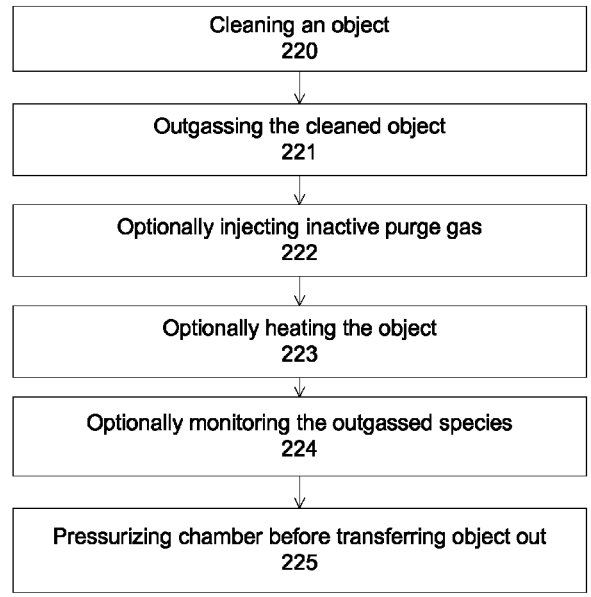
FIGS. 22A-22B illustrate exemplary flowcharts for decontaminating objects according to an embodiment of the present invention.
Figure 22B:
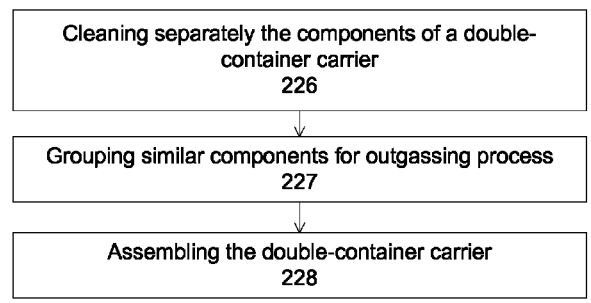

FIGS. 22A-22B illustrate exemplary flowcharts for decontaminating objects according to an embodiment of the present invention. In FIG. 22A, operation 220 cleans an object. Operation 221 outgases the cleaned object. Operation 222 optionally injects inactive purge gas. Operation 223 optionally heats the object. Operation 224 optionally monitors the outgassed species. Operation 225 pressurizes chamber before transferring object out.

In an embodiment, the present invention further discloses a process for decontaminating an object by separating the components of the object for outgassing. In FIG. 22B, operation 226 cleans separately the components of a double-container carrier. Operation 227 groups similar components for outgassing process. Operation 228 assembles the double-container carrier.

In some embodiments, the present invention discloses a method for cleaning a workpiece, wherein the workpiece comprises a first component and a second component, wherein the first component surrounds the second component. The method can include transferring the first component of a workpiece to a first chamber; pumping the ambient within the first chamber; coupling the first chamber to a first gas monitor through a differential valve; transferring the second component of a workpiece to a second chamber; pumping the ambient within the second chamber; coupling the second chamber directly to a second gas monitor.

The method can further include coupling the first chamber directly to a first gas monitor after a signal from the first gas monitor is stable; stopping the pumping after a level of gaseous contaminants in the first or second chamber reaches a desired level; cleaning the first component before transferring to the first chamber; cleaning the second component before transferring to the second chamber; injecting an inactive gas to the first or second chamber during the pumping; heating the first or second component in the first or second chamber during the pumping; and pressurizing the first or second chamber before transferring the first or second component out of the first or second chamber.

In an embodiment, the present invention discloses an assembling station, preferably an integrated assembly station to assemble the separately-cleaned components under a control environment. For high level cleanliness, avoiding exposure to potential sources of contamination should be considered. Thus, after being cleaned separately, the components are assembled in a cleaned environment to maintain the level of cleanliness, for example, to minimize any contamination of the inner container by exposing to outside ambient.

In an embodiment, the assembling station is filled with nitrogen. Thus after transferring from a vacuum decontamination chamber, which was filled with nitrogen before open to the transfer process, the components are transferred to the assembly station, which is filled with nitrogen. The assembling station therefore can preserve the cleanliness of the components after cleaning.

In an embodiment, the present invention discloses an assembling station for assembling double container reticle carrier. The assembling station can provide an assembling process in a clean environment (preferably a nitrogen environment) with nitrogen purge between inner and outer containers.

Figure 23A:
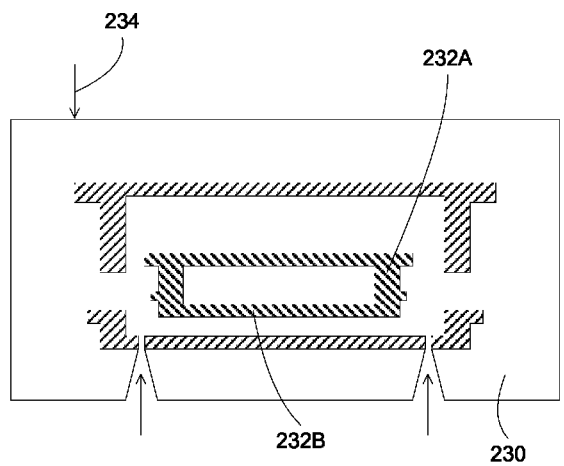
FIGS. 23A-23B illustrate exemplary assembling station and processes according to an embodiment of the present invention.
Figure 23B:
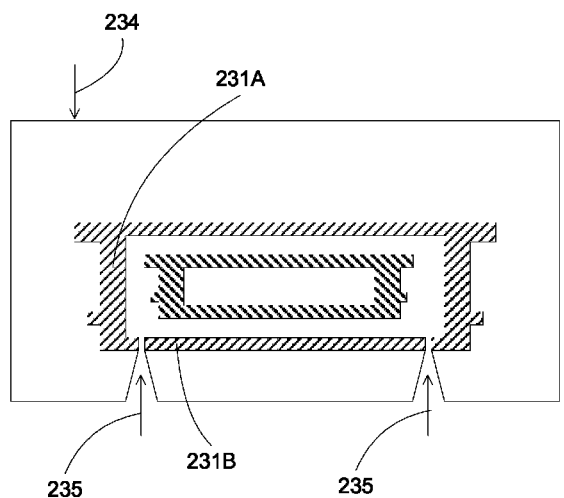

FIGS. 23A-23B illustrate exemplary assembling station and processes according to an embodiment of the present invention. The components 231A/231B and 232A/232B to be assembled are transferred to the assembling station 230, which comprises nitrogen purge gas inlet 234. A bottom support 231B is placed on nitrogen nozzles. Bottom support 232B and top lid 232A are then placed on the bottom support 231B. Top lid 231A is then brought in the assembling station. With the nitrogen nozzles 235 providing nitrogen to the bottom support 231B, the top lid 231A is assembled with the bottom support 231B, effectively purging and providing nitrogen to the volume inside the outer container form by the bottom support 231B and the top lid 231A. With the assembling station under nitrogen ambient, an in some case, preferably slightly pressurized, the assembling station is open and the assembled carrier is then transferred to the outside.

In some embodiments, the present invention discloses a system for cleaning a workpiece, wherein the workpiece comprises a first component and a second component, wherein the first component surrounds the second component. The system can include a first chamber, wherein the first chamber is operable for cleaning the first component of the workpiece; a second chamber, wherein the second chamber is operable for cleaning the second component of the workpiece; a third chamber, wherein the third chamber is operable for assembling the first and second components after being cleaned; a first gas supply coupled to the third chamber, wherein the first gas supply is operable to deliver an inactive gas to the third chamber; a second gas supply coupled to the third chamber, wherein the second gas supply is operable to deliver an inactive gas to an inside of the first or second component. The second gas supply can protrude to within the third chamber to couple with an opening of the first component.

Figure 24A:
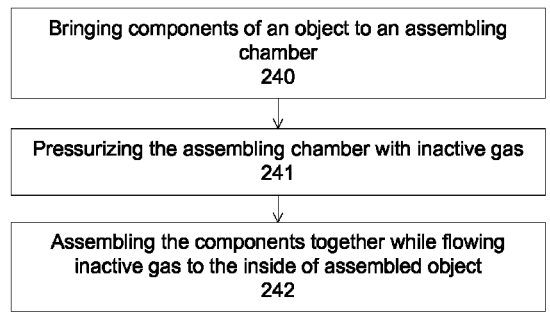
FIGS. 24A-24B illustrate exemplary flowcharts for assembling objects according to an embodiment of the present invention.
Figure 24B:
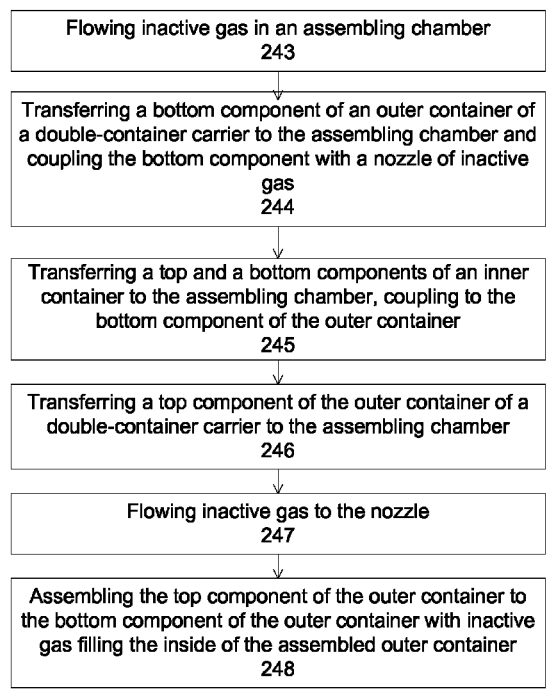

FIGS. 24A-24B illustrate exemplary flowcharts for assembling objects according to an embodiment of the present invention. In FIG. 24A, operation 240 brings components of an object to an assembling chamber. Operation 241 pressurizes the assembling chamber with inactive gas. Operation 242 assembles the components together while flowing inactive gas to the inside of assembled object.

In FIG. 24B, operation 243 flows inactive gas in an assembling chamber. Operation 244 transfers a bottom component of an outer container of a double-container carrier to the assembling chamber and coupling the bottom component with a nozzle of inactive gas. Operation 245 transfers a top and a bottom components of an inner container to the assembling chamber, coupling to the bottom component of the outer container. Operation 246 transfers a top component of the outer container of a double-container carrier to the assembling chamber. Operation 247 flows inactive gas to the nozzle. Operation 248 assembles the top component of the outer container to the bottom component of the outer container with inactive gas filling the inside of the assembled outer container.

In some embodiments, the present invention discloses a method for cleaning a workpiece, wherein the workpiece comprises a first component and a second component, wherein the first component surrounds the second component. The method can include cleaning the first component; cleaning the second component; transferring the first component to a chamber; transferring the second component to the chamber; pressurizing the chamber with an inactive gas; assembling the first and second components to form an assembled workpiece. The first component is disposed on a conduit coupled to a gas supply outside the chamber. The method can further include flowing inactive gas to the conduit.

In an embodiment, the present invention discloses loading and unloading station for a cleaner system with nitrogen purge to the volume inside the objects. To maintain a level of cleanliness for the object inside a carrier, the inside volume is constantly purged with inert gas such as nitrogen. Thus the present invention discloses an inert gas purge for a transfer and/or storage station, ensuring a constant purge of the inside volume.

Figure 25:
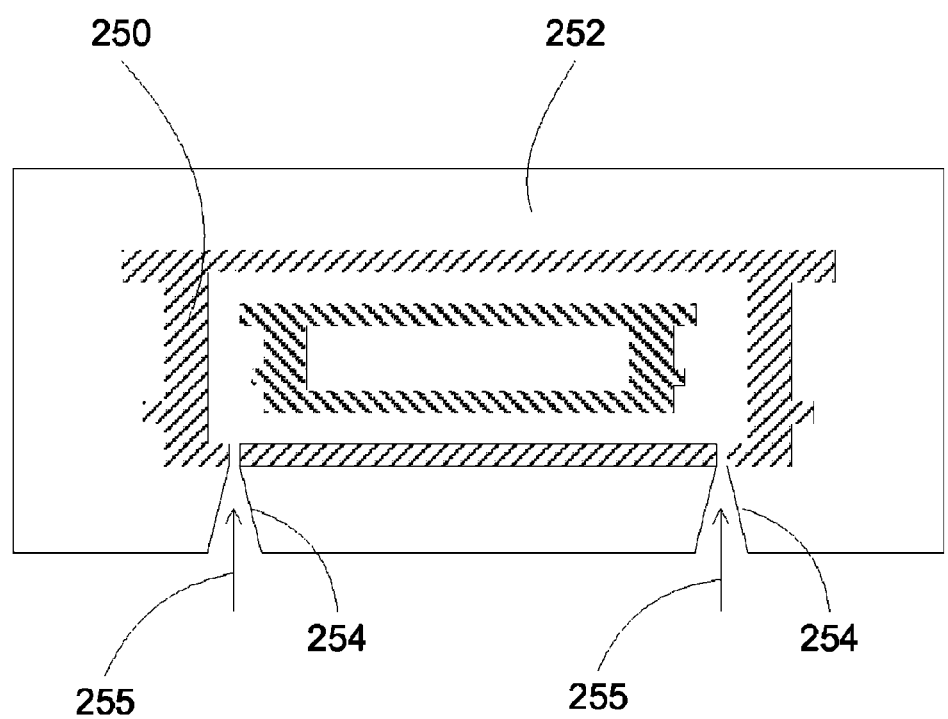
FIG. 25 illustrates an exemplary transfer and/or storage station having purge nozzles according to an embodiment of the present invention.

FIG. 25 illustrates an exemplary transfer and/or storage station having purge nozzles according to an embodiment of the present invention. The double container carrier 250 is placed on nitrogen purge nozzles 254 in the station 252. With the nitrogen nozzles 234 providing nitrogen 255 to the bottom support of the double container carrier 250, the volume inside the outer container is constantly purged with refreshed nitrogen.

In some embodiments, the present invention discloses a system for cleaning a workpiece, wherein the workpiece comprises a first component and a second component, wherein the first component surrounds the second component. The system can include a first chamber, wherein the first chamber is operable for cleaning the first component of the workpiece; a second chamber, wherein the second chamber is operable for cleaning the second component of the workpiece; a third chamber, wherein the third chamber is operable for support an assembled workpiece; a gas supply coupled to the third chamber, wherein the gas supply is operable to deliver an inactive gas to an inside of the assembled workpiece. The gas supply can protrude to within the third chamber to couple with an opening of the first component.

In some embodiments, a method for cleaning a workpiece can include cleaning the first component; cleaning the second component; assembling the first and second components to form an assembled workpiece; flowing inactive gas to an inside of the assembled workpiece. The first component can be disposed on a conduit coupled to a gas supply outside the chamber.

In some embodiments, the present invention discloses a cleaner system for EUV carrier, including separate environments for input (for carriers to be cleaned) and output (for cleaned carriers), flow dynamics for the separate environments, separate cleaning chambers for different parts of the carriers, robot handlers for minimizing cross contamination between the different parts of the carriers, degassing and decontamination chamber for removing outgassing molecules, and purging stations for providing purge gas to the interior of the carriers.

Different configurations of the cleaner system can be used, including single throughput cleaner system, double throughput cleaner system, hybrid cleaner system, and less clean cleaner system.

Figure 26A:
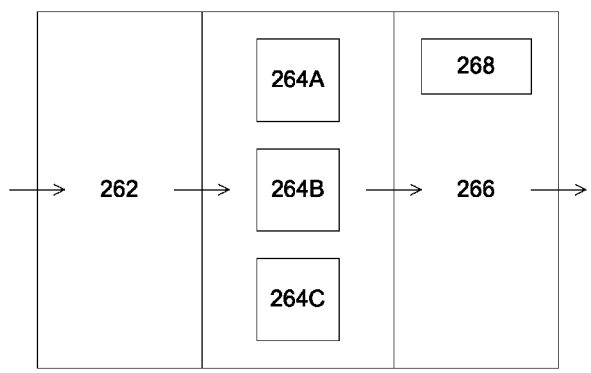
FIGS. 26A-26B illustrate examples of a cleaner according to some embodiments of the present invention.
Figure 26B:
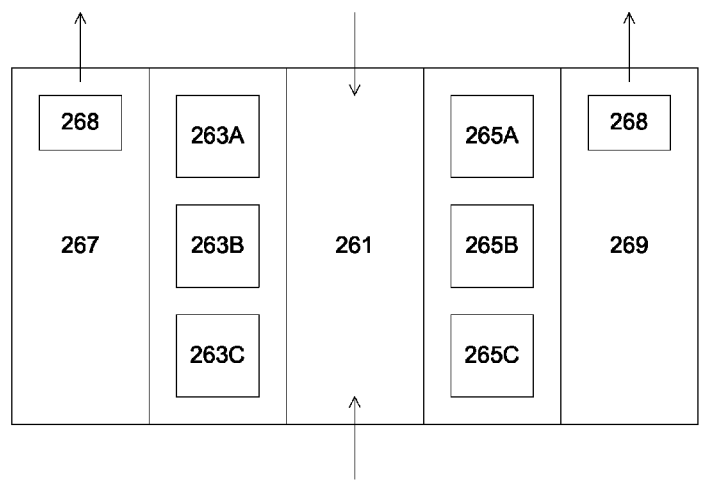

FIGS. 26A-26B illustrate examples of a cleaner according to some embodiments of the present invention. FIG. 26A shows a standard cleaner system, including an input environment 262, e.g., dirty or non-clean environment for the carriers to be cleaned, multiple cleaning chambers 264A-264C, and an output environment 266, e.g., clean environment for the cleaned carriers, together with an outgassing chamber 268 for removing outgasable molecules.

FIG. 26B shows a cleaner system having double the throughput, sharing a same input environment 261, two cleaning sections 263A-263C and 265A-265C, and two output environments 267 and 269, together with two outgassing chamber 268. Carriers to be cleaned can be brought to the input environment 261, transferred to either of the cleaning chamber sections, and outputting to the output environments 267 or 269 after being outgassed.

Figure 27:
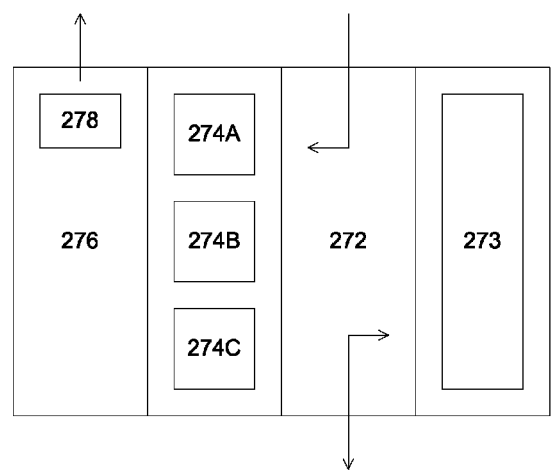
FIG. 27 illustrates an example of a hybrid cleaner system according to some embodiments of the present invention.

FIG. 27 illustrates an example of a hybrid cleaner system according to some embodiments of the present invention. The hybrid cleaner system can include cleaning chambers 271A-271C positioned between output clean environment 276 and input non-clean environment 272, together with cleaning chamber 273 sharing a same input and output environment 272. Thus a conventional reticle box, such as a reticle SMIF pod can be brought to the input environment 272, cleaned in cleaning chamber 273, and outputted to the same input environment 272. A euv carrier can be brought to the input environment 272, cleaned in separate cleaning chambers 274A-274C, and outputted to the output environment 276 after being outgassed in outgassed chamber 278.

Figure 28:
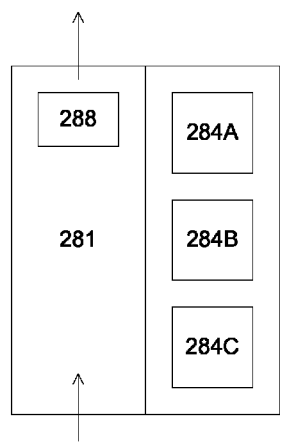
FIG. 28 illustrates an example of a cleaner system according to some embodiments of the present invention.

FIG. 28 illustrates an example of a cleaner system according to some embodiments of the present invention. The cleaner system can utilize a same input and output environment 281, with separate cleaning chambers 284A-284C. A euv carrier can be brought to the input environment 281, cleaned in separate cleaning chambers 284A-284C, and then outputted to the same environment 281 to be outgassed in outgassed chamber 288. Considerations can be applied to avoid contamination in the share environment 281, such as locating the input and output in separate portions of the environment 281, and to provide laminar flow from the output portion to the input portion.

What is claimed is:

1. A method for transferring a workpiece, wherein the workpiece comprises a first component and a second component, the method comprising:
    handling the first component at a first portion on a handler;
    transferring the first component to a first destination;
    handling the second component at a second portion on the handler,
    wherein the second portion is at a different location on the handler than the first portion;
    transferring the second component to a second destination,
    wherein an insert is coupled to the handler,
    wherein the first portion comprises a middle portion of the insert, and wherein the second portion comprises a top and bottom portion of the insert.

2. A method as in claim 1, further comprising:
wherein the first component is handled before the second component, or
wherein the second component is handled before the first component.

3. A method as in claim 1, further comprising:
wherein the handler comprises two gripper arms, and
wherein handling the first or second component comprises adjusting a distance between the two gripper arms for gripping the first or second component, respectively.

4. A method as in claim 1, further comprising:
wherein the handler comprises two gripper arms, and
wherein adjusting a distance between the two gripper arms is performed by a motor.

5. A method as in claim 1, further comprising:
wherein the handling is controlled by a feedback sensor.

6. A method as in claim 1, further comprising:
wherein the first portion comprises a middle portion of an arm of the handler, and the second portion comprises a top or bottom portion of the arm of the handler, or
wherein the first portion comprises a top or bottom portion of an arm of the handler, and the second portion comprises a middle portion of the arm of the handler.

7. A method as in claim 1, further comprising:
wherein handling the first or second component further comprises mating a component on the handler with a corresponding component on the first or second component, respectively.

8. A method as in claim 1, further comprising:
wherein the first destination comprises a first cleaning chamber,
wherein the second destination comprises a second cleaning chamber, and
wherein the first and second cleaning chambers are separate cleaning chambers with different cleanliness levels.

9. A method as in claim 1, further comprising:
wherein the first and second destinations comprise different locations in a chamber.

10. A method for transferring a workpiece, wherein the workpiece comprises a first component and a second component, the method comprising:
adjusting a distance between two gripper arms for gripping the first component;
gripping the first component at a first portion on the two gripper arms;
transferring the first component to a first destination;
adjusting the distance between the two gripper arms for gripping the second component;
gripping the second component at a second portion on the two gripper arms,
wherein the second portion is at a different location than the first portion;
transferring the second component to a second destination, and
wherein handling the first or second component comprises mating a component on the handler with a corresponding component on the first or second component, respectively.

11. A method as in claim 10, further comprising:
wherein an insert is coupled to the two gripper arms,
wherein the first portion comprises a middle portion of the insert, and
wherein the second portion comprises a top or bottom portion of the insert.

12. A method as in claim 10, further comprising:
wherein the first destination comprises a first cleaning chamber,
wherein the second destination comprises a second cleaning chamber, and
wherein the first and second cleaning chambers are separate cleaning chambers with different cleanliness levels.

13. A method for transferring a workpiece, wherein the workpiece comprises a first component and a second component, the method comprising:
adjusting a distance between two gripper arms for gripping the first component; gripping the first component at a first portion on the two gripper arms;
transferring the first component to a first destination;
adjusting the distance between the two gripper arms for gripping the second component;
gripping the second component at a second portion on the two gripper arms,
wherein the second portion is at a different location than the first portion;
transferring the second component to a second destination, and
wherein the first and second destinations comprise different locations in a chamber.

* * * * *